(12) United States Patent
Onodera et al.

(10) Patent No.: US 10,600,570 B2
(45) Date of Patent: Mar. 24, 2020

(54) ELECTRONIC COMPONENT

(71) Applicant: TDK CORPORATION, Tokyo (JP)

(72) Inventors: Shinya Onodera, Tokyo (JP); Takehisa Tamura, Tokyo (JP); Atsushi Takeda, Tokyo (JP); Ken Morita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 24 days.

(21) Appl. No.: 16/166,902

(22) Filed: Oct. 22, 2018

(65) Prior Publication Data

US 2019/0131070 A1 May 2, 2019

(30) Foreign Application Priority Data

Oct. 30, 2017 (JP) .................................. 2017-209365

(51) Int. Cl.
| | | |
|---|---|---|
| H01G 4/12 | (2006.01) |
| H01G 4/232 | (2006.01) |
| H01F 27/29 | (2006.01) |
| H05K 3/12 | (2006.01) |
| H01G 4/30 | (2006.01) |
| H01G 4/005 | (2006.01) |
| H01F 17/00 | (2006.01) |

(52) U.S. Cl.
CPC .......... *H01G 4/12* (2013.01); *H01F 17/0013* (2013.01); *H01F 27/292* (2013.01); *H01G 4/005* (2013.01); *H01G 4/232* (2013.01); *H01G 4/30* (2013.01); *H05K 3/1283* (2013.01)

(58) Field of Classification Search
CPC .......... H01G 4/12; H01G 4/005; H01G 4/232; H01G 4/30; H01F 17/0013; H01F 27/92; H05K 3/1283
See application file for complete search history.

(56) References Cited

U.S. PATENT DOCUMENTS

| | | | | |
|---|---|---|---|---|
| 9,373,446 | B2 * | 6/2016 | Park ...................... | H01G 4/12 |
| 10,381,157 | B2 * | 8/2019 | Ando ..................... | H01G 4/12 |
| 2008/0239617 | A1 * | 10/2008 | Motoki .................. | H01G 4/232 361/301.4 |
| 2015/0022943 | A1 * | 1/2015 | Chae ..................... | H01G 4/232 361/301.4 |
| 2017/0092423 | A1 * | 3/2017 | Iwama .................. | H01G 4/008 |
| 2017/0229246 | A1 * | 8/2017 | Nishiyama ............ | H01G 4/38 |
| 2018/0268999 | A1 * | 9/2018 | Shimada ............... | H01G 4/30 |

FOREIGN PATENT DOCUMENTS

JP          2002-203736 A          7/2002

* cited by examiner

*Primary Examiner* — Dion Ferguson
(74) *Attorney, Agent, or Firm* — Oliff PLC

(57) ABSTRACT

An element body of a rectangular parallelepiped shape includes a first principal surface arranged to constitute a mounting surface, a second principal surface opposing the first principal surface in a first direction, a pair of side surfaces opposing each other in a second direction, and a pair of end surfaces opposing each other in a third direction. An external electrode is disposed at an end portion of the element body in the third direction. The external electrode includes a conductive resin layer. The external electrode includes a plating layer including a first portion covering the first principal surface and a pair of second portions covering the pair of side surfaces. A thickness of the first portion is smaller than each thickness of the pair of second portions.

12 Claims, 15 Drawing Sheets

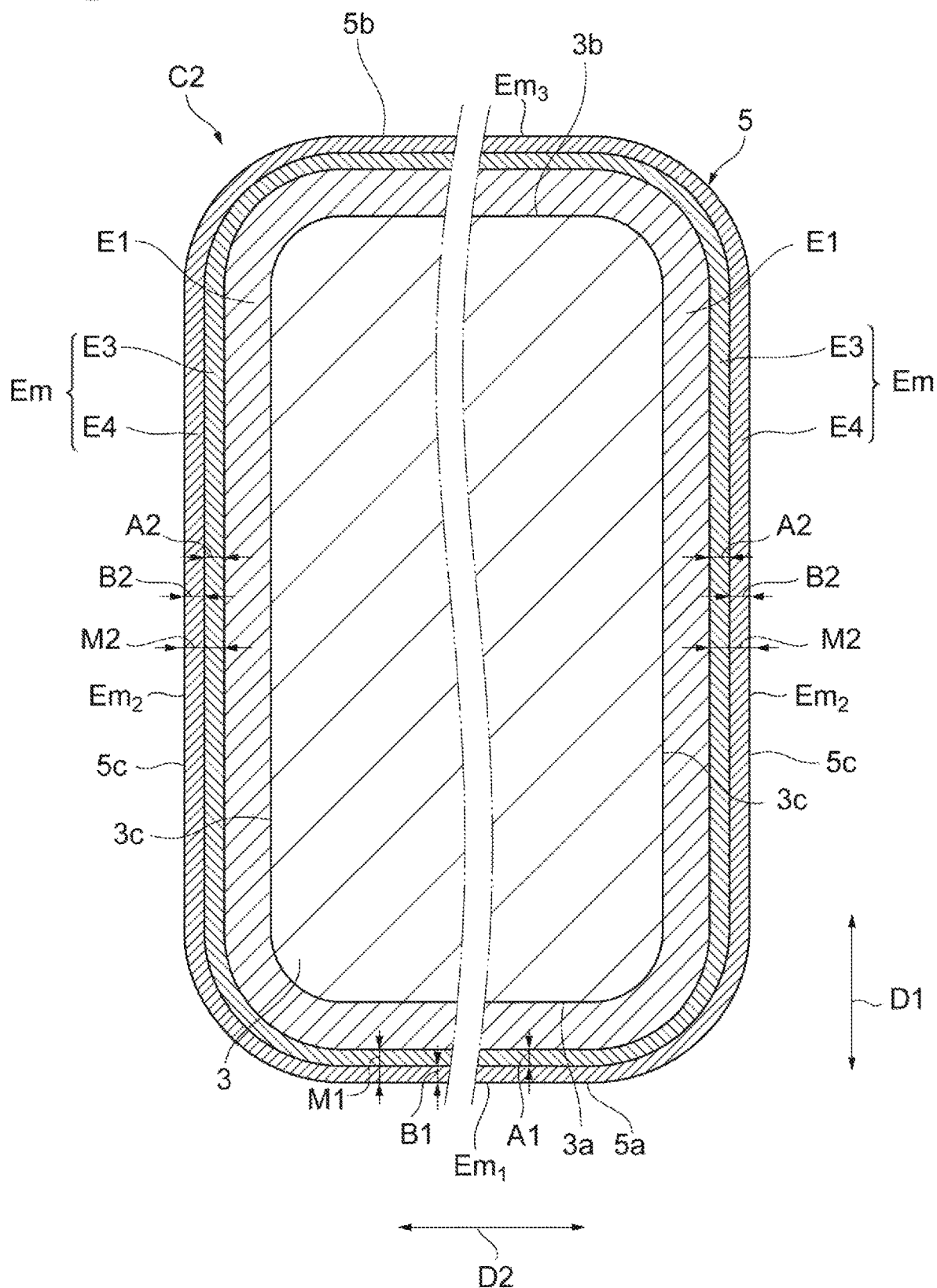

ELECTRONIC COMPONENT

BACKGROUND OF THE INVENTION

1. Field of the Invention

The present invention relates to an electronic component.

2. Description of Related Art

Known electronic components include an element body of a rectangular parallelepiped shape and a plurality of external electrodes (see, for example, Japanese Unexamined Patent Publication No. 2002-203736). The element body includes a pair of principal surfaces opposing each other, a pair of end surfaces opposing each other, and a pair of side surfaces opposing each other. The plurality of external electrodes is disposed at each end portion of the element body in a direction in which the pair of end surfaces opposes each other. The external electrode includes a plating layer.

SUMMARY OF THE INVENTION

In a case in which the electronic component is solder-mounted on an electronic device, the external electrode and the electronic device are joined by solder. The electronic device includes, for example, a circuit board or an electronic component. The plating layer ensures bonding strength by soldering. However, in a case in which the external electrode includes the plating layer, the following problems may be caused. Stress generated at a formation of the plating layer may remain as residual stress inside the plating layer. In a case in which the residual stress acts on the element body, a crack may occur in the element body.

An object of one aspect of the present invention is to provide an electronic component that ensures bonding strength by soldering and suppresses occurrence of a crack in an element body.

An electronic component according to one aspect includes an element body of a rectangular parallelepiped shape and a plurality of external electrode. The element body includes a first principal surface arranged to constitute a mounting surface, a second principal surface opposing the first principal surface in a first direction, a pair of side surfaces opposing each other in a second direction, and a pair of end surfaces opposing each other in a third direction. The plurality of external electrodes is disposed at both end portions of the element body in the third direction. The plurality of external electrodes includes a plating layer including a first portion covering the first principal surface and a pair of second portions covering the pair of side surfaces. A thickness of the first portion is smaller than each thickness of the pair of second portions.

In the one aspect, the thickness of the plating layer is smaller at the first portion than at each second portion, and thus residual stress of the first portion is small. Therefore, the one aspect suppresses occurrence of a crack due to the residual stress acting on the first principal surface. Since the thickness of the plating layer is larger at each second portion than at the first portion, in a case in which the external electrode and an electronic device are joined by soldering, the solder tends to run around each second portion. Therefore, the one aspect ensures bonding strength by soldering between the external electrode and the electronic device. Consequently, the one aspect ensures the bonding strength by soldering and suppresses the occurrence of a crack in the element body.

In a case in which an element is described as covering another element, the element may directly cover the other element or indirectly cover the other element.

In the one aspect, each area of the pair of second portions may be smaller than an area of the first portion. In a case in which the thickness of the plating layer is larger at each second portion than at the first portion, the residual stress at each second portion may increase. A configuration in which the area of each second portion is smaller than the area of the first portion suppresses an increase in residual stress at each second portion. Therefore, this configuration suppresses the occurrence of a crack due to the residual stress acting on each side surface.

In the one aspect, each of the pair of second portions may be disposed in a region near the first principal surface of a corresponding side surface of the pair of side surfaces. In this configuration, the area of each second portion is small, as compared with in a configuration in which each second portion is disposed to extend between the first principal surface and the second principal surface. Therefore, even in a case in which the residual stress in the second portion increases due to the large thickness of the second portion, this configuration suppresses an increase in residual stress in the second portion. Consequently, this configuration suppresses the occurrence of a crack due to the residual stress acting on each side surface.

In the one aspect, each of the plurality of external electrodes may include a conductive resin layer covering one part of the first principal surface and one part of each of the pair of side surfaces. The plating layer may be disposed on the conductive resin layer. In this case, the conductive resin layer is located between the first principal surface and pair of side surfaces and the plating layer. Therefore, residual stress of the plating layer tends not to act on the element body. Consequently, this configuration reliably suppresses the occurrence of a crack in the element body.

In the one aspect, each of the plurality of external electrodes may be formed on a corresponding end surface of the pair of end surfaces. The conductive resin layer may cover one part of the corresponding end surface.

A region between the element body and the conductive resin layer may include a path through which moisture infiltrates. In a case in which moisture infiltrates from the region between the element body and the conductive resin layer, durability of the electronic component decreases. This configuration includes few paths through which moisture infiltrates, as compared with a configuration in which the conductive resin layer covers the entire end surface. Therefore, this configuration improves moisture resistance reliability.

In a case in which the electronic component is solder-mounted on an electronic device, external force applied onto the electronic component from the electronic device may act as stress on the element body. The electronic device includes, for example, a circuit board or an electronic component. The external force acts on the element body from a solder fillet formed at the solder-mounting, through the external electrode. In this case, a crack may occur in the element body. The external force tends to act on a region defined by the one part of the first principal surface, the one part of each of the pair of side surfaces, and the one part of the end surface, in the element body. In a case in which the conductive resin layer covers the one part of the first principal surface, the one part of each of the pair of side surfaces, and the one part of the end surface, the external force applied onto the electronic component from the electronic device tends not to act on the element body. Therefore, this configuration suppresses occurrence of a crack in the element body.

The one aspect may include an internal conductor exposed to the corresponding end surface of the pair of end surfaces. Each of the plurality of external electrodes may include a sintered metal layer formed at least on the end surface to be connected to the internal conductor. In this configuration, the external electrode is favorably in contact with the internal conductor by the sintered metal layer. Therefore, this configuration allows reliable electrical connection between the external electrode and the internal conductor that correspond to each other.

In the one aspect, the sintered metal layer may include a first region covered with the conductive resin layer and a second region exposed from the conductive resin layer. For example, the conductive resin layer includes a conductive material and a resin. The conductive material includes, for example, metal powder. The resin includes, for example, a thermosetting resin. Electric resistance of the conductive resin layer is larger than electric resistance of the sintered metal layer. In a case in which the sintered metal layer includes the second region, the second region is electrically connected to the electronic device without passing through the conductive resin layer. Therefore, this configuration suppresses an increase in equivalent series resistance (ESR) even in a case in which the external electrode includes the conductive resin layer.

In the one aspect, the sintered metal layer may be formed on a first ridge portion located between the first principal surface and the end surface. The conductive resin layer may cover an entirety of a portion of the sintered metal layer formed on the first ridge portion. The bonding strength between the conductive resin layer and the element body is smaller than the bonding strength between the conductive resin layer and the sintered metal layer. Therefore, the conductive resin layer may peel off from the element body. In this configuration, the sintered metal layer is formed on the first ridge portion. Consequently, even in a case in which the conductive resin layer peels off from the element body, the peel-off of the conductive resin layer tends not to develop to a position corresponding to the end surface beyond a position corresponding to the first ridge portion.

In the one aspect, the sintered metal layer may be also formed on a second ridge portion located between the side surface and the end surface. The conductive resin layer may cover one part of a portion of the sintered metal layer formed on the second ridge portion. In this configuration, the sintered metal layer is formed on the second ridge portion. Therefore, even in a case in which the conductive resin layer peels off from the element body, the peel-off of the conductive resin layer tends not to develop to a position corresponding to the end surface beyond a position corresponding to the second ridge portion.

In the one aspect, the plating layer may include an outermost layer, and an intermediate layer that is located inside the outermost layer and includes an Ni plating layer. This configuration improves solder corrosion resistance.

In the one aspect, the plating layer may include an outermost layer including an Sn plating layer. This configuration improves solder-bonding strength.

The present invention will become more fully understood from the detailed description given hereinafter and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 15 is a view illustrating a cross-sectional configuration of the multilayer capacitor taken along line XV-XV in FIG. 13.

DETAILED DESCRIPTION OF EMBODIMENTS

Figure 1:
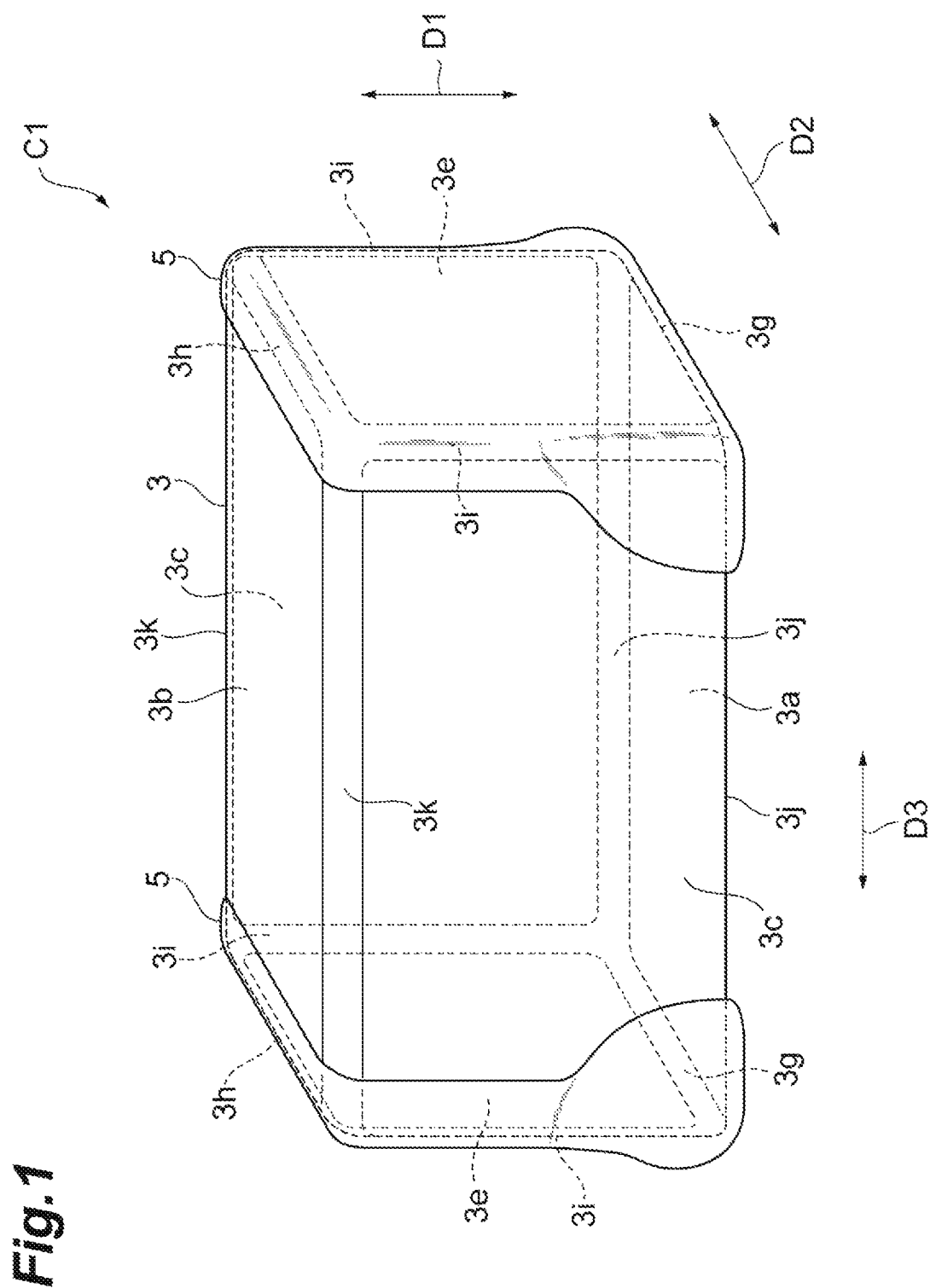
FIG. 1 is a perspective view of a multilayer capacitor according to a first embodiment.

Hereinafter, embodiments of the present invention will be described in detail with reference to the accompanying drawings. In the following description, the same elements or elements having the same functions are denoted with the same reference numerals and overlapped explanation is omitted.

First Embodiment

Figure 2:
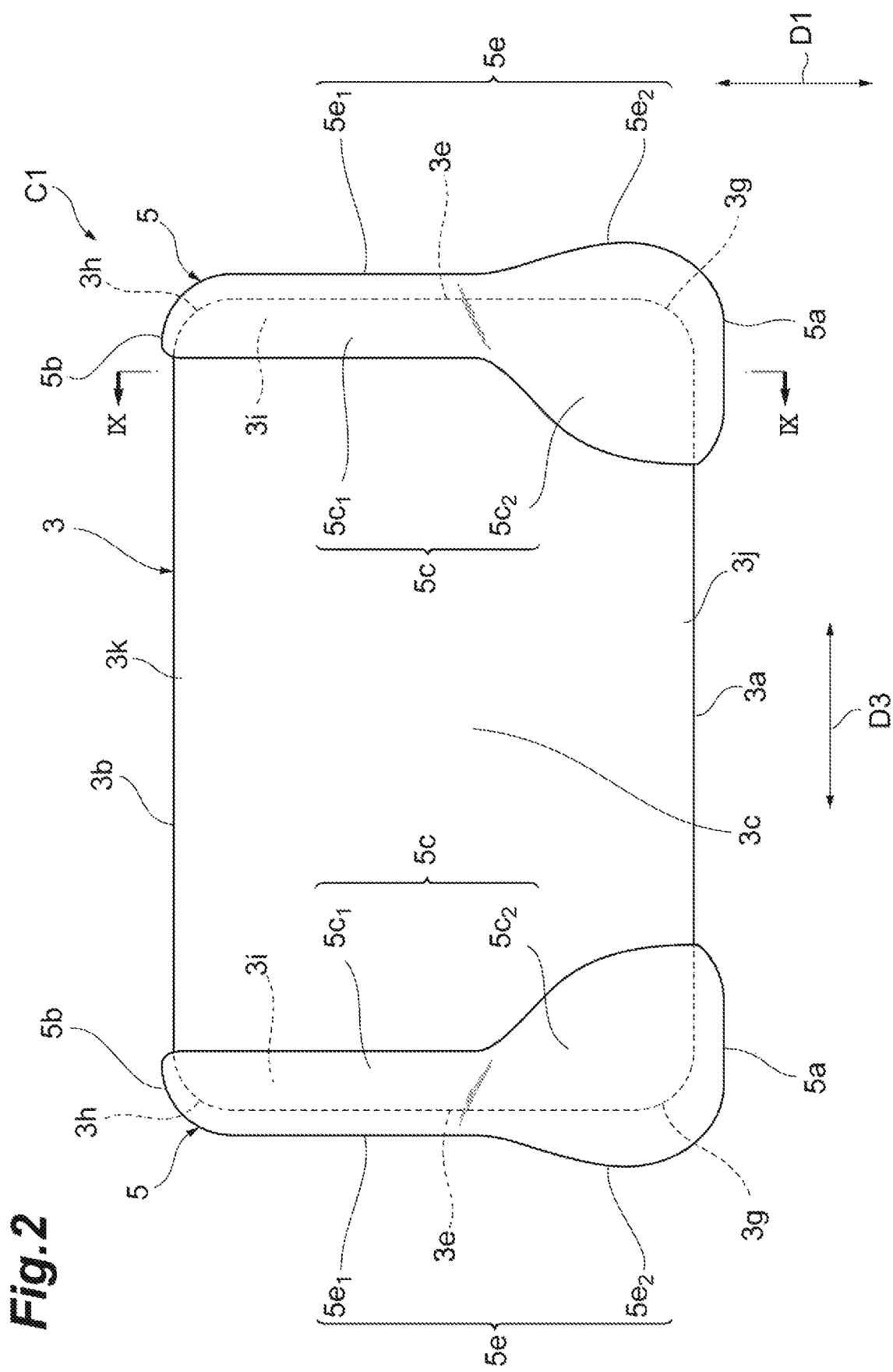
FIG. 2 is a side view of the multilayer capacitor according to the first embodiment.
Figure 3:
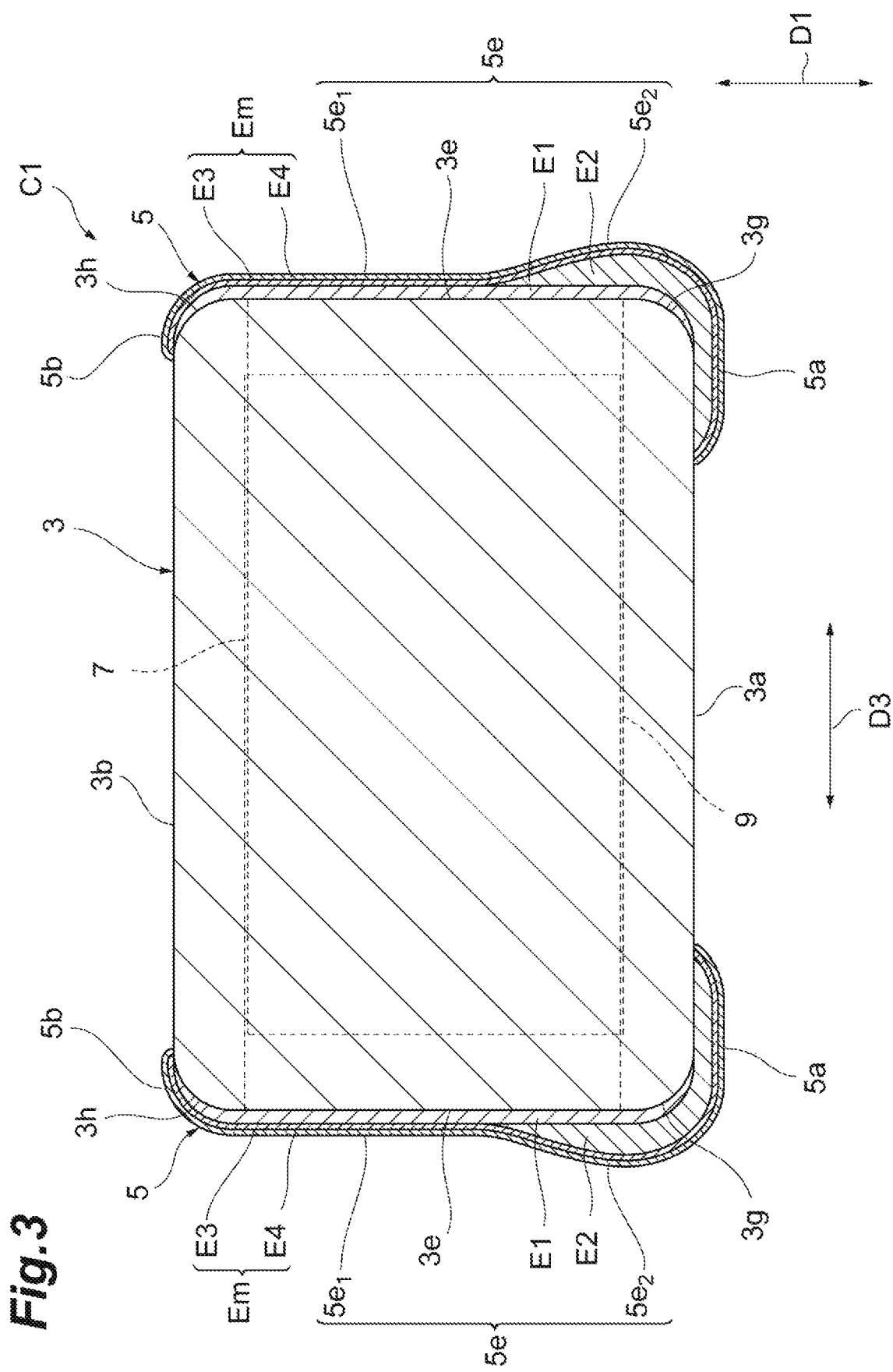
FIG. 3 is a view illustrating a cross-sectional configuration of the multilayer capacitor according to the first embodiment.
Figure 4:
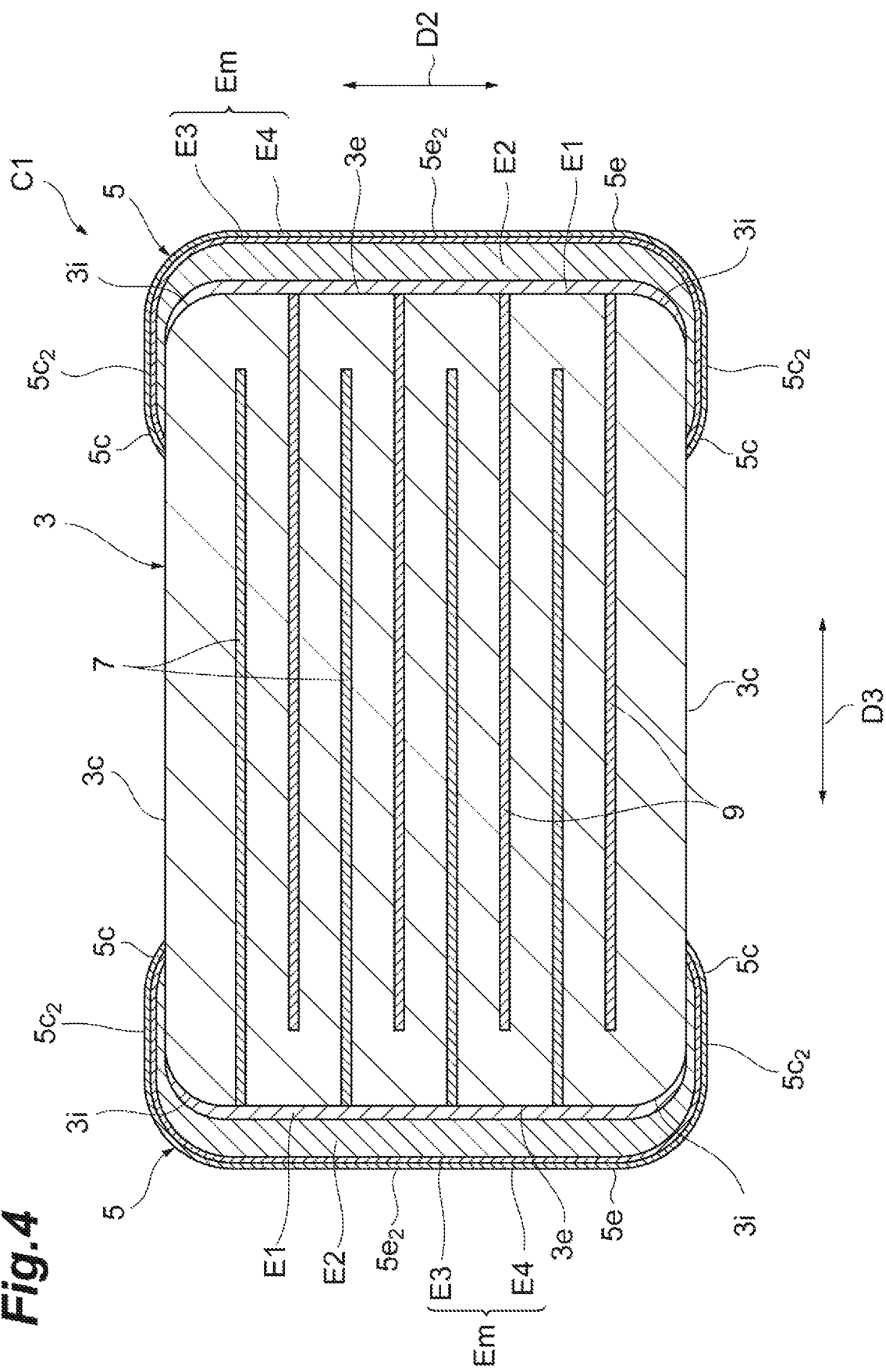
FIG. 4 is a view illustrating the cross-sectional configuration of the multilayer capacitor according to the first embodiment.
Figure 5:
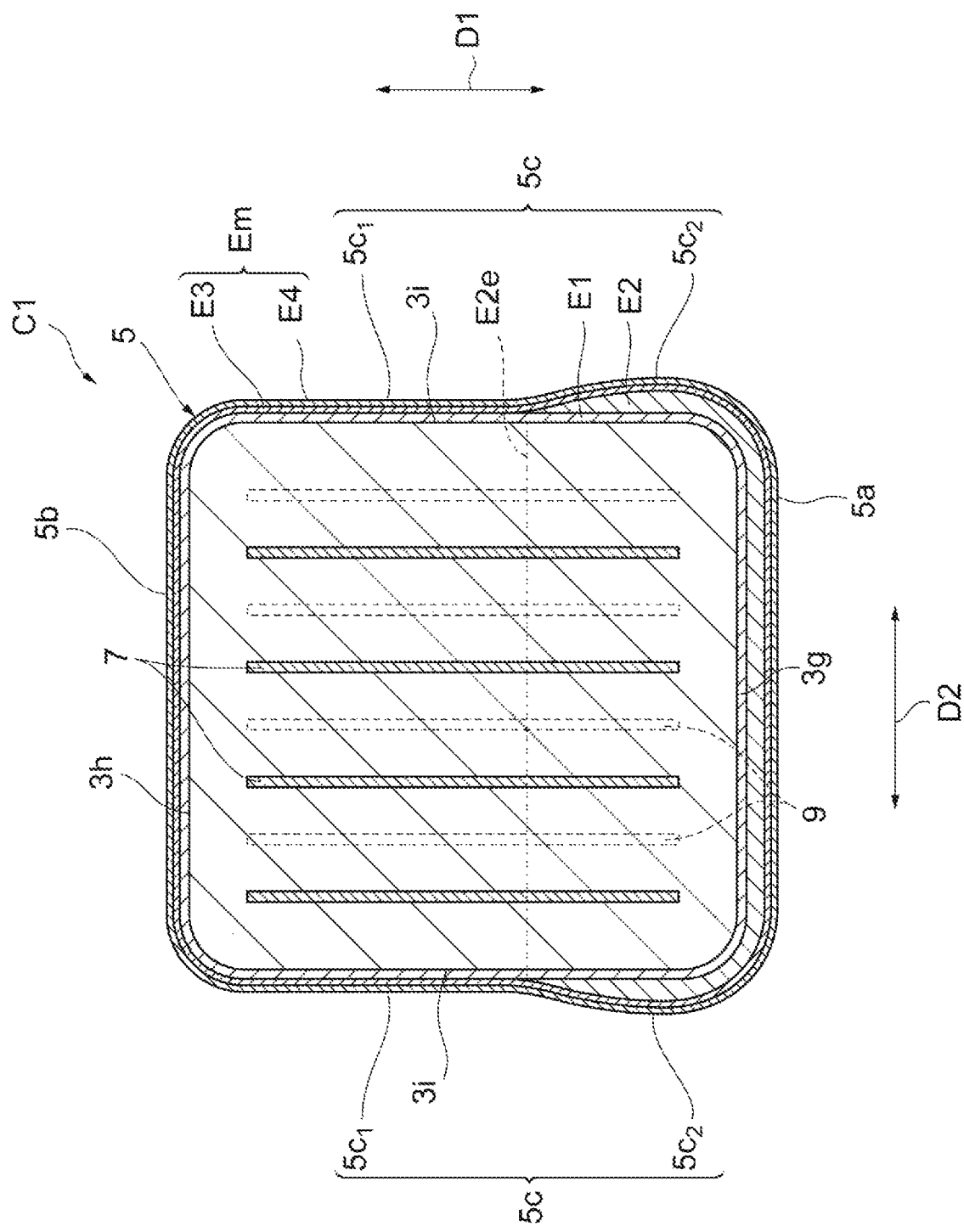
FIG. 5 is a view illustrating the cross-sectional configuration of the multilayer capacitor according to the first embodiment.
Figure 6:
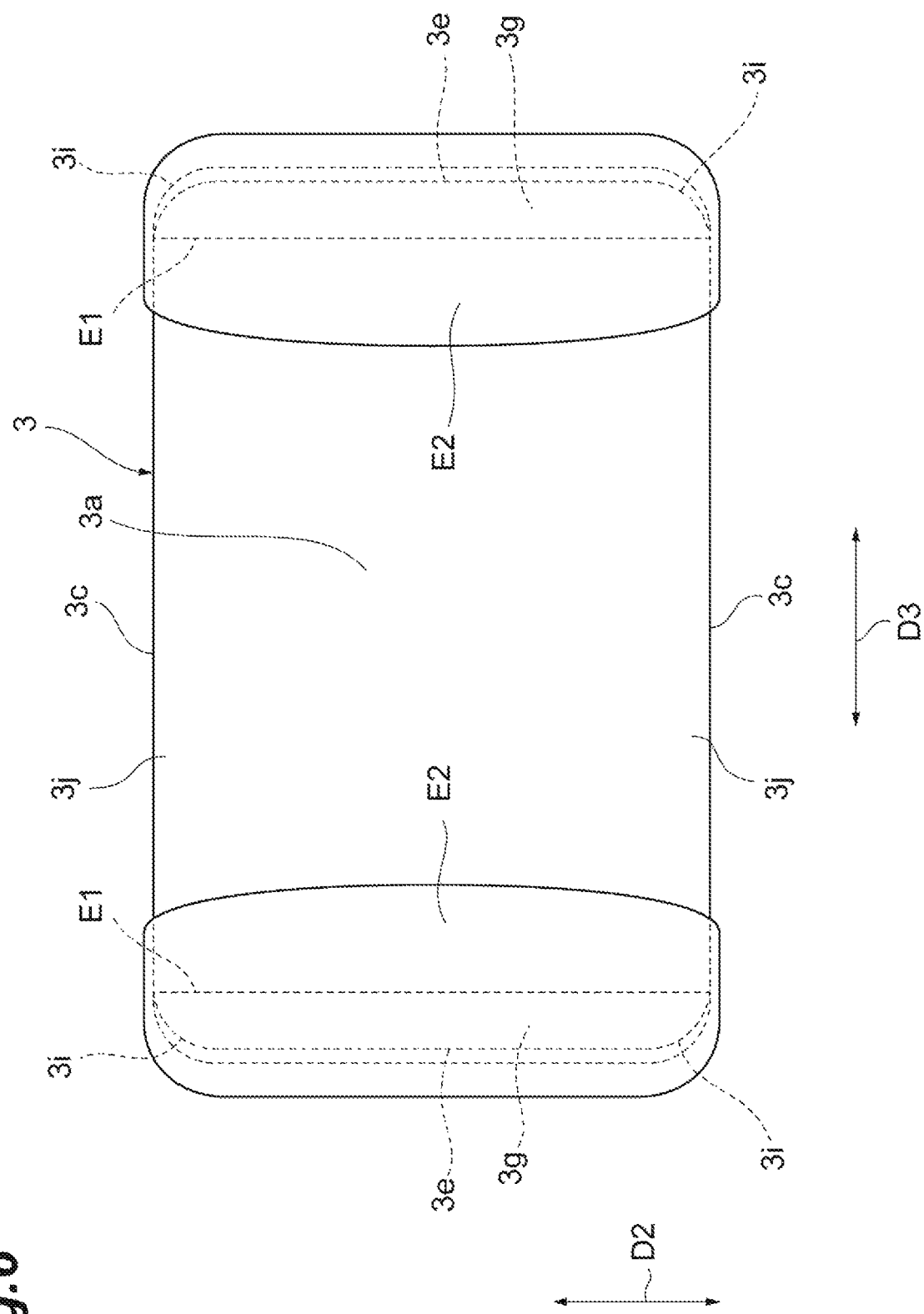
FIG. 6 is a plan view illustrating an element body, a first electrode layer, and a second electrode layer.
Figure 7:
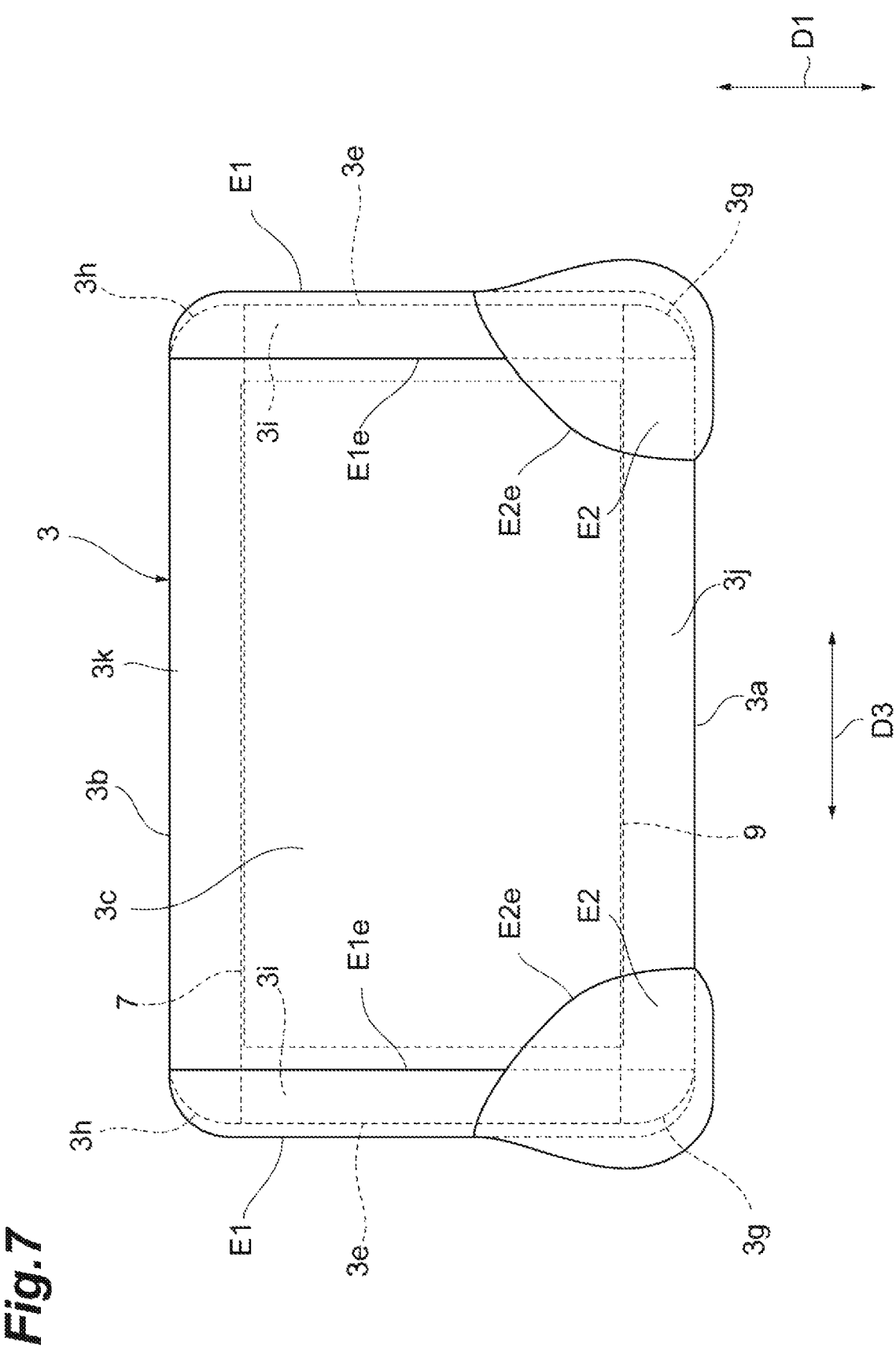
FIG. 7 is a side view illustrating the element body, the first electrode layer, and the second electrode layer.
Figure 8:
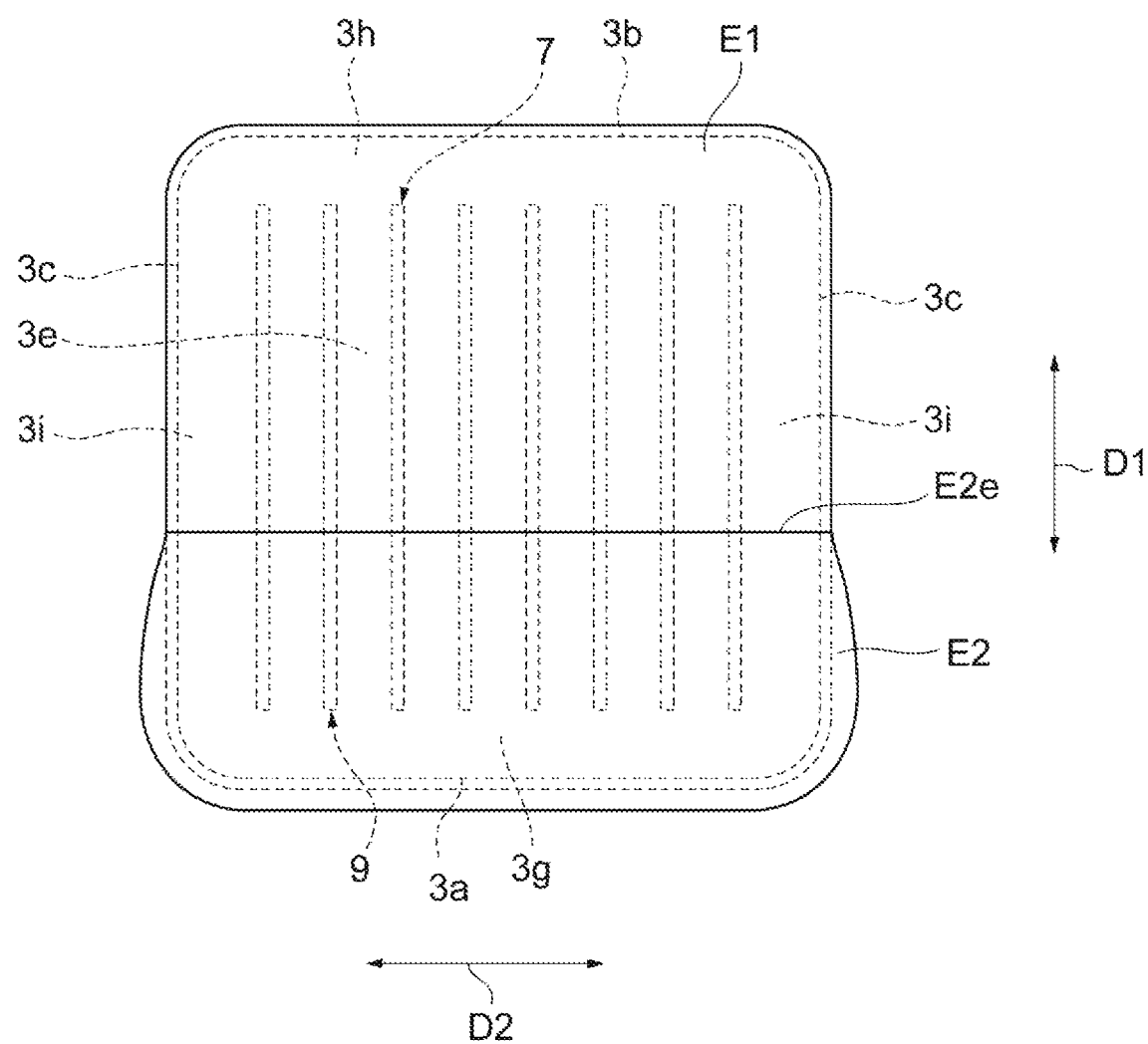
FIG. 8 is an end view illustrating the element body, the first electrode layer, and the second electrode layer.

A configuration of a multilayer capacitor C1 according to a first embodiment will be described with reference to FIGS. 1 to 8. FIG. 1 is a perspective view of the multilayer capacitor according to the first embodiment. FIG. 2 is a side view of the multilayer capacitor according to the first embodiment. FIGS. 3 to 5 are views illustrating a cross-sectional configuration of the multilayer capacitor according to the first embodiment. FIG. 6 is a plan view illustrating an element body, a first electrode layer, and a second electrode layer. FIG. 7 is a side view illustrating the element body, the first electrode layer, and the second electrode layer. FIG. 8 is an end view illustrating the element body, the first electrode layer, and the second electrode layer. In the first embodiment, an electronic component is, for example, the multilayer capacitor C1.

As illustrated in FIG. 1, the multilayer capacitor C1 includes an element body 3 of a rectangular parallelepiped shape and a plurality of external electrodes 5. In the present embodiment, the multilayer capacitor C1 includes a pair of external electrodes 5. The pair of external electrodes 5 is disposed on an outer surface of the element body 3. The pair of external electrodes 5 is separated from each other. The rectangular parallelepiped shape includes a rectangular parallelepiped shape in which corners and ridges are chamfered, and a rectangular parallelepiped shape in which the corners and ridges are rounded.

The element body 3 includes a pair of principal surfaces 3a and 3b opposing each other, a pair of side surfaces 3c opposing each other, and a pair of end surfaces 3e opposing each other. The pair of principal surfaces 3a and 3b and the pair of side surfaces 3c have a rectangular shape. The direction in which the pair of principal surfaces 3a and 3b opposes each other is a first direction D1. The direction in which the pair of side surfaces 3c opposes each other is a second direction D2. The direction in which the pair of end surfaces 3e opposes each other is a third direction D3. The multilayer capacitor C1 is solder-mounted on an electronic device. The electronic device includes, for example, a circuit board or an electronic component. The principal surface 3a of the multilayer capacitor C1 opposes the electronic device. The principal surface 3a is arranged to constitute a mounting surface. The principal surface 3a is the mounting surface.

The first direction D1 is a direction orthogonal to the respective principal surfaces 3a and 3b and is orthogonal to the second direction D2. The third direction D3 is a direction parallel to the respective principal surfaces 3a and 3b and the respective side surfaces 3c, and is orthogonal to the first direction D1 and the second direction D2. The second direction D2 is a direction orthogonal to the respective side surfaces 3c. The third direction D3 is a direction orthogonal to the respective end surfaces 3e. In the first embodiment, a length of the element body 3 in the third direction D3 is larger than a length of the element body 3 in the first direction D1, and larger than a length of the element body 3 in the second direction D2. The third direction D3 is a longitudinal direction of the element body 3. The length of the element body 3 in the second direction D2 is approximately equal to the length of the element body 3 in the first direction D1.

The pair of side surfaces 3c extends in the first direction D1 to couple the pair of principal surfaces 3a and 3b. The pair of side surfaces 3c also extends in the third direction D3. The pair of end surfaces 3e extends in the first direction D1 to couple the pair of principal surfaces 3a and 3b. The pair of end surfaces 3e also extends in the second direction D2.

The element body 3 includes a pair of ridge portions 3g, a pair of ridge portions 3h, four ridge portions 3i, a pair of ridge portions 3j, and a pair of ridge portions 3k. The ridge portion 3g is located between the end surface 3e and the principal surface 3a. The ridge portion 3h is located between the end surface 3e and the principal surface 3b. The ridge portion 3i is located between the end surface 3e and the side surface 3c. The ridge portion 3j is located between the principal surface 3a and the side surface 3c. The ridge portion 3k is located between the principal surface 3b and the side surface 3c. In the present embodiment, each of the ridge portions 3g, 3h, 3i, 3j, and 3k is rounded to curve. The element body 3 is subject to what is called a round chamfering process.

The end surface 3e and the principal surface 3a are indirectly adjacent to each other with the ridge portion 3g between the end surface 3e and the principal surface 3a. The end surface 3e and the principal surface 3b are indirectly adjacent to each other with the ridge portion 3h between the end surface 3e and the principal surface 3b. The end surface 3e and the side surface 3c are indirectly adjacent to each other with the ridge portion 3i between the end surface 3e and the side surface 3c. The principal surface 3a and the side surface 3c are indirectly adjacent to each other with the ridge portion 3j between the principal surface 3a and the side surface 3c. The principal surface 3b and the side surface 3c are indirectly adjacent to each other with the ridge portion 3k between the principal surface 3b and the side surface 3c.

The element body 3 is configured by laminating a plurality of dielectric layers in the second direction D2. The element body 3 includes the plurality of laminated dielectric layers. In the element body 3, a lamination direction of the plurality of dielectric layers coincides with the second direction D2. Each dielectric layer includes, for example, a sintered body of a ceramic green sheet containing a dielectric material. The dielectric material includes, for example, a dielectric ceramic of $BaTiO_3$ base, $Ba(Ti,Zr)O_3$ base, or $(Ba,Ca)TiO_3$ base. In an actual element body 3, each of the dielectric layers is integrated to such an extent that a boundary between the dielectric layers cannot be visually recognized. In the element body 3, the lamination direction of the plurality of dielectric layers may coincide with the first direction D1.

As illustrated in FIGS. 3, 4, and 5, the multilayer capacitor C1 includes a plurality of internal electrodes 7 and a plurality of internal electrodes 9. Each of the internal electrodes 7 and 9 is an internal conductor disposed in the element body 3. Each of the internal electrodes 7 and 9 is made of a conductive material that is commonly used as an internal conductor of a multilayer electronic component. The conductive material includes, for example, a base metal. The conductive material includes, for example, Ni or Cu. Each of the internal electrodes 7 and 9 is configured as a sintered body of conductive paste containing the conductive material described above. In the first embodiment, the internal electrodes 7 and 9 are made of Ni.

The internal electrodes 7 and the internal electrodes 9 are disposed in different positions (layers) in the second direction D2. The internal electrodes 7 and the internal electrodes 9 are alternately disposed in the element body 3 to oppose each other in the second direction D2 with an interval therebetween. Polarities of the internal electrodes 7 and the internal electrodes 9 are different from each other. In a case in which the lamination direction of the plurality of dielectric layers is the first direction D1, the internal electrodes 7 and the internal electrodes 9 are disposed in different positions (layers) in the first direction D1. One end of each of the internal electrodes 7 and 9 is exposed to a corresponding end surface 3e of the pair of the end surfaces 3e. Each of the internal electrodes 7 and 9 includes one end exposed to the corresponding end surface 3e. The plurality of internal electrodes 7 and the plurality of internal electrodes 9 are alternately disposed in the second direction D2. The internal electrodes 7 and 9 are located in a plane approximately orthogonal to the principal surfaces 3a and 3b. The internal electrodes 7 and the internal electrodes 9 oppose each other in the second direction D2. The direction (second direction D2) in which the internal electrodes 7 and the internal electrodes 9 oppose each other is orthogonal to the direction (first direction D1) orthogonal to the principal surfaces 3a and 3b.

As illustrated in FIG. 2, the external electrodes 5 are disposed at both end portions of the element body 3 in the third direction D3. Each of the external electrodes 5 is disposed on the corresponding end surface 3e side of the element body 3. As illustrated in FIGS. 3, 4, and 5, the external electrode 5 includes a plurality of electrode portions 5a, 5b, 5c, and 5e. The electrode portion 5a is disposed on the principal surface 3a and the ridge portion 3g. The electrode portion 5b is disposed on the ridge portion 3h. The electrode portion 5c is disposed on each side surface 3c and each ridge portion 3i. The electrode portion 5e is disposed on the corresponding end surface 3e. The external electrode 5 also includes electrode portions disposed on the ridge portion 3j.

The external electrode 5 is formed on the four surfaces, that is, the principal surface 3a, the end surface 3e, and the pair of side surfaces 3c, as well as on the ridge portions 3g, 3h, 3i, and 3j. The electrode portions 5a, 5b, 5c, and 5e adjacent each other are coupled and are electrically connected to each other. In the present embodiment, the external electrode 5 is not intentionally formed on a principal surface 3b. Each electrode portion 5e covers all one ends of the corresponding internal electrodes 7 or 9. Each of the internal electrodes 7 and 9 is directly connected to the corresponding electrode portion 5e. Each of the internal electrodes 7 and 9 is electrically connected to the corresponding external electrode 5.

As illustrated in FIGS. 3, 4, and 5, the external electrode 5 includes a first electrode layer E1, a second electrode layer E2, a third electrode layer E3, and a fourth electrode layer E4. The fourth electrode layer E4 is arranged to constitute the outermost layer of the external electrode 5. Each of the electrode portions 5a, 5c, and 5e includes the first electrode layer E1, the second electrode layer E2, the third electrode layer E3, and the fourth electrode layer E4. The electrode portion 5b includes the first electrode layer E1, the third electrode layer E3, and the fourth electrode layer E4.

The electrode portion 5a is four-layered on the ridge portion 3g, and is three-layered on the principal surface 3a. The electrode portion 5a includes the first electrode layer E1, the second electrode layer E2, the third electrode layer E3, and the fourth electrode layer E4 on the ridge portion 3g, and includes the second electrode layer E2, the third electrode layer E3, and the fourth electrode layer E4 on the principal surface 3a. The first electrode layer E1 included in the electrode portion 5a is disposed on the ridge portion 3g, and is not disposed on the principal surface 3a. The first electrode layer E1 included in the electrode portion 5a is in contact with the entire ridge portion 3g. The ridge portion 3g is entirely covered with the first electrode layer E1. The principal surface 3a is not covered with the first electrode layer E1, thereby being exposed from the first electrode layer E1. The first electrode layer E1 is entirely covered with the second electrode layer E2. In the electrode portion 5a, the second electrode layer E2 is in contact with one part of the principal surface 3a and the entire first electrode layer E1.

As described above, in a case in which an element is described as covering another element, the element may directly cover the other element or indirectly cover the other element. In a case in which an element is described as indirectly covering another element, an intervening element is present between the element and the other element. In a case in which an element is described as directly covering another element, no intervening element is present between the element and the other element.

The second electrode layer E2 included in the electrode portion 5a is disposed on the first electrode layer E1 and the principal surface 3a. The second electrode layer E2 included in the electrode portion 5a is formed to cover the entire ridge portion 3g and the one part of the principal surface 3a. The one part of the principal surface 3a is, for example, the partial region near the end surface 3e, in the principal surface 3a. That is, the one part of the principal surface 3a is close to the end surface 3e. The second electrode layer E2 included in the electrode portion 5a indirectly covers the entire ridge portion 3g in such a manner that the first electrode layer E1 is located between the second electrode layer E2 and the ridge portion 3g. The second electrode layer E2 included in the electrode portion 5a directly covers the one part of the principal surface 3a. The second electrode layer E2 included in the electrode portion 5a directly covers an entire portion of the first electrode layer E1 formed on the ridge portion 3g.

The third electrode layer E3 included in the electrode portion 5a is disposed on the second electrode layer E2. The third electrode layer E3 included in the electrode portion 5a is formed to cover the entire ridge portion 3g and one part of the principal surface 3a. The one part of the principal surface 3a is, for example, the partial region near the end surface 3e, in the principal surface 3a. That is, the one part of the principal surface 3a is close to the end surface 3e. The third electrode layer E3 included in the electrode portion 5a indirectly covers the entire ridge portion 3g in such a manner that the first electrode layer E1 and second electrode layer E2 are located between the third electrode layer E3 and the ridge portion 3g. The third electrode layer E3 included in the electrode portion 5a indirectly covers the one part of the principal surface 3a in such a manner that the second electrode layer E2 is located between the third electrode layer E3 and the principal surface 3a. The third electrode layer E3 included in the electrode portion 5a directly covers the entire portion of the second electrode layer E2 indirectly covering the ridge portion 3g. The third electrode layer E3 included in the electrode portion 5a directly covers the entire portion of the second electrode layer E2 formed on the principal surface 3a.

The fourth electrode layer E4 included in the electrode portion 5a is disposed on the third electrode layer E3. The fourth electrode layer E4 included in the electrode portion 5a is formed to cover the entire ridge portion 3g and one part of the principal surface 3a. The one part of the principal surface 3a is, for example, the partial region near the end surface 3e, in the principal surface 3a. That is, the one part of the principal surface 3a is close to the end surface 3e. The fourth electrode layer E4 included in the electrode portion 5a indirectly covers the entire ridge portion 3g in such a manner that the first electrode layer E1, the second electrode layer E2, and the third electrode layer E3 are located between the fourth electrode layer E4 and the ridge portion 3g. The fourth electrode layer E4 included in the electrode portion 5a indirectly covers the one part of the principal surface 3a in such a manner that the second electrode layer E2 and the third electrode layer E3 are located between the fourth electrode layer E4 and the principal surface 3a. The fourth electrode layer E4 included in the electrode portion 5a directly covers the entire portion of the third electrode layer E3 indirectly covering the ridge portion 3g. The fourth electrode layer E4 included in the electrode portion 5a directly covers the entire portion of the third electrode layer E3 indirectly covering the principal surface 3a.

The electrode portion 5b is three-layered. The first electrode layer E1 included in the electrode portion 5b is disposed on the ridge portion 3h, and is not disposed on the principal surface 3b. The first electrode layer E1 included in the electrode portion 5b is in contact with the entire ridge portion 3h. The ridge portion 3h is entirely covered with the first electrode layer E1. The principal surface 3b is not covered with the first electrode layer E1, and is exposed from the first electrode layer E1. The electrode portion 5b does not include the second electrode layer E2. The principal surface 3b is not covered with the second electrode layer E2, and is exposed from the second electrode layer E2. The second electrode layer E2 is not formed on the principal surface 3b.

The third electrode layer E3 included in the electrode portion 5b is disposed on the first electrode layer E1. The third electrode layer E3 included in the electrode portion 5b is formed to cover the entire ridge portion 3h. The third electrode layer E3 included in the electrode portion 5b indirectly covers the entire ridge portion 3h in such a manner that the first electrode layer E1 is located between the third electrode layer E3 and the ridge portion 3h. The third electrode layer E3 included in the electrode portion 5b directly covers the entire portion of the first electrode layer E1 formed on the ridge portion 3h. The principal surface 3b is not covered with the third electrode layer E3, and is exposed from the third electrode layer E3. The third electrode layer E3 is not formed on the principal surface 3b.

The fourth electrode layer E4 included in the electrode portion 5b is disposed on the third electrode layer E3. The fourth electrode layer E4 included in the electrode portion 5b is formed to cover the entire ridge portion 3h. The fourth electrode layer E4 included in the electrode portion 5b indirectly covers the entire ridge portion 3h in such a manner that the first electrode layer E1 and third electrode layer E3 are located between the fourth electrode layer E4 and the ridge portion 3h. The fourth electrode layer E4 included in the electrode portion 5b directly covers the entire portion of the third electrode layer E3 indirectly covering the ridge portion 3h. The principal surface 3b is not covered with the fourth electrode layer E4, and is exposed from the fourth electrode layer E4. The fourth electrode layer E4 is not formed on the principal surface 3b.

The electrode portion 5c includes a plurality of regions $5c_1$ and $5c_2$. The region $5c_2$ is located closer to the principal surface 3a than the region $5c_1$. In the present embodiment, the electrode portion 5c includes only two regions $5c_1$, $5c_2$. The region $5c_1$ includes the first electrode layer E1, the third electrode layer E3, and the fourth electrode layer E4. The region $5c_1$ does not include the second electrode layer E2. The region $5c_1$ is three-layered. The region $5c_2$ includes the first electrode layer E1, the second electrode layer E2, the third electrode layer E3, and the fourth electrode layer E4. The region $5c_2$ is four-layered on the ridge portion 3i, and is three-layered on the side surface 3c. The region $5c_1$ is the region where the first electrode layer E1 is exposed from the second electrode layer E2. The region $5c_2$ is the region where the first electrode layer E1 is covered with the second electrode layer E2.

The first electrode layer E1 included in the electrode portion 5c is disposed on the ridge portion 3i, and is not disposed on the side surface 3c. The first electrode layer E1 included in the electrode portion 5c is in contact with the entire ridge portion 3i. The ridge portion 3i is entirely covered with the first electrode layer E1. The side surface 3c is not covered with the first electrode layer E1, and is exposed from the first electrode layer E1.

The second electrode layer E2 included in the electrode portion 5c is disposed on the first electrode layer E1 and the side surface 3c. The second electrode layer E2 included in the electrode portion 5c is formed to cover one part of the ridge portion 3i and one part of the side surface 3c. The one part of the ridge portion 3i is, for example, the partial region near the principal surface 3a, in the ridge portion 3i. That is, the one part of the ridge portion 3i is close to the principal surface 3a. The one part of the side surface 3c is, for example, the corner region near the principal surface 3a and end surface 3e, in the side surface 3c. That is, the one part of the side surface 3c is close to the principal surface 3a and end surface 3e. The second electrode layer E2 included in the electrode portion 5c indirectly covers the one part of the ridge portion 3i in such a manner that the first electrode layer E1 is located between the second electrode layer E2 and the ridge portion 3i. The second electrode layer E2 included in the electrode portion 5c directly covers the one part of the side surface 3c. The second electrode layer E2 included in the electrode portion 5c directly covers one part of the portion of the first electrode layer E1 formed in the ridge portion 3i. In the electrode portion 5c, the one part of the first electrode layer E1 is covered with the second electrode layer E2. In the electrode portion 5c, the second electrode layer E2 is in contact with the one part of the side surface 3c and the one part of the first electrode layer E1.

The third electrode layer E3 in the region $5c_1$ is disposed on the first electrode layer E1. The third electrode layer E3 in the region $5c_1$ is formed to cover one part of the ridge portion 3i. The one part of the ridge portion 3i is, for example, the partial region near the principal surface 3b, in the ridge portion 3i. That is, the one part of the ridge portion 3i is close to the principal surface 3b. The third electrode layer E3 in the region $5c_1$ indirectly covers the one part of the ridge portion 3i in such a manner that the first electrode layer E1 is located between the third electrode layer E3 and the ridge portion 3i. The third electrode layer E3 in the region $5c_1$ directly covers one part of the first electrode layer E1 formed on the ridge portion 3i.

The fourth electrode layer E4 in the region $5c_1$ is disposed on the third electrode layer E3. The fourth electrode layer E4 in the region $5c_1$ is formed to cover one part of the ridge portion 3i. The one part of the ridge portion 3i is, for example, the partial region near the principal surface 3b, in the ridge portion 3i. That is, the one part of the ridge portion 3i is close to the principal surface 3b. The fourth electrode layer E4 in the region $5c_1$ indirectly covers the one part of the ridge portion 3i in such a manner that the first electrode layer E1 and third electrode layer E3 are located between the fourth electrode layer E4 and the ridge portion 3i. The fourth electrode layer E4 in the region $5c_1$ directly covers one part of the third electrode layer E3 indirectly covering the ridge portion 3i.

The third electrode layer E3 in the region $5c_2$ is disposed on the second electrode layer E2. The third electrode layer E3 in the region $5c_2$ is formed to cover one part of the ridge portion 3i and one part of the side surface 3c. The one part of the ridge portion 3i is, for example, the partial region near the principal surface 3a, in the ridge portion 3i. That is, the one part of the ridge portion 3i is close to the principal surface 3a. The one part of the side surface 3c is, for example, the corner region near the principal surface 3a and end surface 3e, in the side surface 3c. That is, the one part of the side surface 3c is close to the principal surface 3a and end surface 3e. The third electrode layer E3 in the region $5c_2$ indirectly covers the one part of the ridge portion 3i in such a manner that the first electrode layer E1 and second electrode layer E2 are located between the third electrode layer E3 and the ridge portion 3i. The third electrode layer E3 in the region $5c_2$ indirectly covers the one part of the side surface 3c in such a manner that the second electrode layer E2 is located between the third electrode layer E3 and the side surface 3c. The third electrode layer E3 in the region $5c_2$ directly covers the entire second electrode layer E2 formed on the ridge portion 3i. The third electrode layer E3 in the region $5c_2$ directly covers the entire portion of the second electrode layer E2 indirectly covering the ridge portion 3i and the entire portion of the second electrode layer E2 formed on the side surface 3c.

The fourth electrode layer E4 in the region $5c_2$ is disposed on the third electrode layer E3. The fourth electrode layer E4 in the region $5c_2$ is formed to cover one part of the ridge portion 3i and one part of the side surface 3c. The one part of the ridge portion 3i is, for example, the partial region near the principal surface 3a, in the ridge portion 3i. That is, the one part of the ridge portion 3i is close to the principal surface 3a. The one part of the side surface 3c is, for example, the corner region near the principal surface 3a and end surface 3e, in the side surface 3c. That is, the one part of the side surface 3c is close to the principal surface 3a and end surface 3e. The fourth electrode layer E4 in the region $5c_2$ indirectly covers the one part of the ridge portion 3i in such a manner that the first electrode layer E1, second electrode layer E2, and third electrode layer E3 are located between the fourth electrode layer E4 and the ridge portion 3i. The fourth electrode layer E4 in the region $5c_2$ indirectly covers the one part of the side surface 3c in such a manner that the second electrode layer E2 and third electrode layer E3 are located between the fourth electrode layer E4 and the side surface 3c. The fourth electrode layer E4 in the region $5c_2$ directly covers the entire portion of the third electrode layer E3 indirectly covering the ridge portion 3i and the entire portion of the third electrode layer E3 indirectly covering the side surface 3c.

The electrode portion 5e includes a plurality of regions $5e_1$ and $5e_2$. The region $5e_2$ is located closer to the principal surface 3a than the region $5e_1$. In the present embodiment, the electrode portion 5e includes only two regions $5e_1$, $5e_2$. The region $5e_1$ includes the first electrode layer E1, the third electrode layer E3, and the fourth electrode layer E4. The region $5e_1$ does not include the second electrode layer E2. The region $5e_1$ is three-layered. The region $5e_2$ includes the first electrode layer E1, the second electrode layer E2, the third electrode layer E3, and the fourth electrode layer E4. The region $5e_2$ is four-layered. The region $5e_1$ is the region where the first electrode layer E1 is exposed from the second electrode layer E2. The region $5e_2$ is the region where the first electrode layer E1 is covered with the second electrode layer E2.

The first electrode layer E1 included in the electrode portion 5e is disposed on the end surface 3e. The end surface 3e is entirely covered with the first electrode layer E1. The first electrode layer E1 included in the electrode portion 5e is in contact with the entire end surface 3e. The first electrode layer E1 included in the electrode portion 5e is formed on the end surface 3e to be coupled to the one ends of the corresponding internal electrodes 7 or 9.

The second electrode layer E2 included in the electrode portion 5e is disposed on the first electrode layer E1. The second electrode layer E2 included in the electrode portion 5e is formed to cover one part of the end surface 3e. The one part of the end surface 3e is, for example, the partial region near the principal surface 3a, in the end surface 3e. That is, the one part of the end surface 3e is close to the principal surface 3a. The second electrode layer E2 included in the electrode portion 5e indirectly covers the one part of the end surface 3e in such a manner that the first electrode layer E1 is located between the second electrode layer E2 and the end surface 3e. The second electrode layer E2 included in the electrode portion 5e directly covers one part of the portion of the first electrode layer E1 formed on the end surface 3e. One part of the first electrode layer E1 is covered with the second electrode layer E2. The second electrode layer E2 is in contact with the one part of the first electrode layer E1.

The third electrode layer E3 in the region $5e_1$ is disposed on the first electrode layer E1. The third electrode layer E3 in the region $5e_1$ is formed to cover one part of the end surface 3e. The one part of the end surface 3e is, for example, the partial region near the principal surface 3b, in the end surface 3e. That is, the one part of the end surface 3e is close to the principal surface 3b. The third electrode layer E3 in the region $5e_1$ indirectly covers the one part of the end surface 3e in such a manner that the first electrode layer E1 is located between the third electrode layer E3 and the end surface 3e. The third electrode layer E3 in the region $5e_1$ directly covers one part of the first electrode layer E1 formed on the end surface 3e.

The fourth electrode layer E4 in the region $5e_1$ is disposed on the third electrode layer E3. The fourth electrode layer E4 in the region $5e_1$ is formed to cover one part of the end surface 3e. The one part of the end surface 3e is, for example, the partial region near the principal surface 3b, in the end surface 3e. That is, the one part of the end surface 3e is close to the principal surface 3b. The fourth electrode layer E4 in the region $5e_1$ indirectly covers the one part of the end surface 3e in such a manner that the first electrode layer E1 and third electrode layer E3 are located between the fourth electrode layer E4 and the end surface 3e. The fourth electrode layer E4 in the region $5e_1$ directly covers one part of the third electrode layer E3 indirectly covering the end surface 3e.

The third electrode layer E3 in the region $5e_2$ is disposed on the second electrode layer E2. The third electrode layer E3 in the region $5e_2$ is formed to cover one part of the end surface 3e. The one part of the end surface 3e is, for example, the partial region near the principal surface 3a, in the end surface 3e. That is, the one part of the end surface 3e is close to the principal surface 3a. The third electrode layer E3 in the region $5e_2$ indirectly covers the one part of the end surface 3e in such a manner that the first electrode layer E1 and second electrode layer E2 are located between the third electrode layer E3 and the end surface 3e. The third electrode layer E3 in the region $5e_2$ directly covers the entire portion of the second electrode layer E2 indirectly covering the end surface 3e.

The fourth electrode layer E4 in the region $5e_2$ is disposed on the third electrode layer E3. The fourth electrode layer E4 in the region $5e_2$ is formed to cover one part of the end surface 3e. The one part of the end surface 3e is, for example, the partial region near the principal surface 3a, in the end surface 3e. That is, the one part of the end surface 3e is close to the principal surface 3a. The fourth electrode layer E4 in the region $5e_2$ indirectly covers the one part of the end surface 3e in such a manner that the first electrode layer E1, second electrode layer E2, and third electrode layer E3 are located between the fourth electrode layer E4 and the end surface 3e. The fourth electrode layer E4 in the region 5$e_2$ directly covers the entire portion of the third electrode layer E3 indirectly covering the end surface 3$e$.

The first electrode layer E1 is formed by sintering conductive paste applied onto the surface of the element body 3. The first electrode layer E1 is formed to cover the end surface 3$e$ and the ridge portions 3$g$, 3$h$, and 3$i$. The first electrode layer E1 is formed by sintering a metal component (metal powder) contained in the conductive paste. The first electrode layer E1 includes a sintered metal layer. The first electrode layer E1 includes a sintered metal layer formed on the element body 3. The first electrode layer E1 is not intentionally formed on the pair of principal surfaces 3$a$ and 3$b$ and the pair of side surfaces 3$c$. The first electrode layer E1 may be unintentionally formed on the principal surfaces 3$a$ and 3$b$ and the side surfaces 3$c$ due to a production error, for example.

In the present embodiment, the first electrode layer E1 is a sintered metal layer made of Cu. The first electrode layer E1 may be a sintered metal layer made of Ni. The first electrode layer E1 contains a base metal. The conductive paste contains, for example, powder made of Cu or Ni, a glass component, an organic binder, and an organic solvent.

The second electrode layer E2 is formed by curing conductive resin applied onto the first electrode layer E1, the principal surface 3$a$, and the pair of side surfaces 3$c$. The second electrode layer E2 is formed over the first electrode layer E1 and the element body 3. The second electrode layer E2 covers a partial region of the first electrode layer E1. The second electrode layer E2 covers the regions, of the first electrode layer E1, corresponding to the electrode portion 5$a$, the region 5$c_2$ of the electrode portion 5$c$, and the region 5$e_2$ of the electrode portion 5$e$. The second electrode layer E2 directly covers the one part of the ridge portion 3$j$. The second electrode layer E2 is in contact with the one part of the ridge portion 3$j$. The first electrode layer E1 serves as an underlying metal layer for forming the second electrode layer E2. The second electrode layer E2 is a conductive resin layer formed on the first electrode layer E1.

The conductive resin contains, for example, a resin, a conductive material, and an organic solvent. The resin is, for example, a thermosetting resin. The conductive material is, for example, metal powder. The metal powder is, for example, Ag powder or Cu powder. The thermosetting resin is, for example, a phenolic resin, an acrylic resin, a silicone resin, an epoxy resin, or a polyimide resin. Electric resistance of the second electrode layer E2 is larger than electric resistance of the first electrode layer E1.

The third electrode layer E3 is formed on the second electrode layer E2 and the first electrode layer E1 by plating method. The third electrode layer E3 is formed on a portion of the first electrode layer E1 exposed from the second electrode layer E2. The third electrode layer E3 directly covers the second electrode layer E2 and the portion of the first electrode layer E1 exposed from the second electrode layer E2. In the present embodiment, the third electrode layer E3 is formed on the first electrode layer E1 and the second electrode layer E2 by Ni plating. The third electrode layer E3 is a Ni plating layer. The third electrode layer E3 may be an Sn plating layer, a Cu plating layer, or an Au plating layer. The third electrode layer E3 contains Ni, Sn, Cu, or Au.

The fourth electrode layer E4 is formed on the third electrode layer E3 by plating method. The fourth electrode layer E4 indirectly covers the second electrode layer E2 and the portion of the first electrode layer E1 exposed from the second electrode layer E2 in such a manner that the third electrode layer E3 is located between the fourth electrode layer E4 and the second electrode layer E2 and portion of the first electrode layer E1 exposed from the second electrode layer E2. In the present embodiment, the fourth electrode layer E4 is formed on the third electrode layer E3 by Sn plating. The fourth electrode layer E4 is an Sn plating layer. The fourth electrode layer E4 may be a Cu plating layer or an Au plating layer. The fourth electrode layer E4 contains Sn, Cu, or Au.

The third electrode layer E3 and the fourth electrode layer E4 constitute a plating layer Em formed on the second electrode layer E2. The external electrode 5 includes the plating layer Em including the third electrode layer E3 and the fourth electrode layer E4. In the present embodiment, the plating layer Em is two-layered. The third electrode layer E3 is located inside the fourth electrode layer E4 arranged to constitute the outermost layer. The third electrode layer E3 is an intermediate layer located between the outermost layer and a base layer. In the present embodiment, the plating layer Em includes the Sn plating layer arranged to constitute the outermost layer, and the Ni plating layer arranged to constitute the intermediate layer.

The first electrode layer E1 included in the electrode portion 5$a$, the first electrode layer E1 included in the electrode portion 5$b$, the first electrode layer E1 included in the electrode portion 5$c$, and the first electrode layer E1 included in the electrode portion 5$e$ are integrally formed. The second electrode layer E2 included in the electrode portion 5$a$, the second electrode layer E2 included in the electrode portion 5$c$, and the second electrode layer E2 included in the electrode portion 5$e$ are integrally formed. The third electrode layer E3 included in the electrode portion 5$a$, the third electrode layer E3 included in the electrode portion 5$b$, the third electrode layer E3 included in the electrode portion 5$c$, and the third electrode layer E3 included in the electrode portion 5$e$ are integrally formed. The fourth electrode layer E4 included in the electrode portion 5$a$, the fourth electrode layer E4 included in the electrode portion 5$b$, the fourth electrode layer E4 included in the electrode portion 5$c$, and the fourth electrode layer E4 included in the electrode portion 5$e$ are integrally formed.

Each of the first electrode layers E1 (first electrode layers E1 included in the electrode portions 5$e$) is formed on the end surface 3$e$ to be connected to the respective internal electrodes 7 and 9. The first electrode layer E1 covers the entire end surface 3$e$, the entire ridge portion 3$g$, the entire ridge portion 3$h$, and the entire ridge portion 3$i$. The second electrode layer E2 (second electrode layer E2 included in the electrode portions 5$a$, 5$c$, and 5$e$) continuously covers one part of the principal surface 3$a$, one part of the end surface 3$e$, and one part of each of the pair of side surfaces 3$c$. The second electrode layer E2 integrally covers a region near the end surface 3$e$ of the principal surface 3$a$, a region near the principal surface 3$a$ of the end surface 3$e$, and a region near the principal surface 3$a$ of the side surface 3$c$. The second electrode layer E2 does not cover the principal surface 3$b$.

The second electrode layer E2 (second electrode layer E2 included in the electrode portions 5$a$, 5$c$, and 5$e$) covers the entire ridge portion 3$g$, one part of the ridge portion 3$i$, and one part of the ridge portion 3$j$. The second electrode layer E2 covers the entire ridge portion 3$g$, the one part of the ridge portion 3$i$, and the one part of the ridge portion 3$j$ in such a manner that the first electrode layer E1 is located between the second electrode layer E2 and the ridge portions 3$g$, 3$i$, and 3$j$. The second electrode layer E2 directly covers the entire portion formed on the ridge portion 3$g$, one part of the portion formed on the ridge portion 3$i$, and one part of the portion formed on the ridge portion 3$j$, in the first electrode layer E1. The second electrode layer E2 includes a plurality of portions each corresponding to the one part of the principal surface 3a, the one part of the end surface 3e, the one part of each of the pair of side surfaces 3c, the entire ridge portion 3g, the one part of the ridge portion 3i, and the one part of the ridge portion 3j.

The first electrode layer E1 (first electrode layer E1 included in the electrode portions 5a, 5b, 5c, and 5e) includes a region covered with the second electrode layer E2 (second electrode layer E2 included in the electrode portions 5a, 5c, and 5e), and a region not covered with the second electrode layer E2 (second electrode layer E2 included in the electrode portions 5a, 5c, and 5e). The region not covered with the second electrode layer E2 is a region exposed from the second electrode layer E2. The third electrode layer E3 and fourth electrode layer E4 cover a region of the first electrode layer E1 not covered with the second electrode layer E2 and the second electrode layer E2. The first electrode layer E1 (first electrode layer E1 included in the electrode portion 5e) is directly connected to the respective internal electrodes 7 and 9.

As illustrated in FIG. 6, when viewed from the first direction D1, the entire portion of the first electrode layer E1 (first electrode layer E1 included in the electrode portion 5a) is covered with the second electrode layer E2. When viewed from the first direction D1, the first electrode layer E1 (first electrode layer E1 included in the electrode portion 5a) is not exposed from the second electrode layer E2.

As illustrated in FIG. 7, when viewed in the second direction D2, the end region near the principal surface 3a of the first electrode layer E1 is covered with the second electrode layer E2. The end region near the principal surface 3a of the first electrode layer E1 includes the first electrode layer E1 included in the region $5c_2$. When viewed from the second direction D2, the end edge E2e of the second electrode layer E2 crosses the end edge E1e of the first electrode layer E1. When viewed from the second direction D2, the end region near the principal surface 3b of the first electrode layer E1 is exposed from the second electrode layer E2. The end region near the principal surface 3b of the first electrode layer E1 includes the first electrode layer E1 included in the region $5c_1$. An area of the second electrode layer E2 located on the side surface 3c and the ridge portion 3i is larger than an area of the first electrode layer E1 located on the ridge portion 3i.

As illustrated in FIG. 8, when viewed from the third direction D3, the end region near the principal surface 3a of the first electrode layer E1 is covered with the second electrode layer E2. The end region near the principal surface 3a of the first electrode layer E1 includes the first electrode layer E1 included in the region $5e_2$. When viewed from the third direction D3, the end edge E2e of the second electrode layer E2 is located on the first electrode layer E1. When viewed from the third direction D3, the end region near the principal surface 3b of the first electrode layer E1 is exposed from the second electrode layer E2. The end region near the principal surface 3b of the first electrode layer E1 includes the first electrode layer E1 included in the region $5e_1$. An area of the second electrode layer E2 located on the end surface 3e and the ridge portion 3g is smaller than an area of the first electrode layer E1 located on the end surface 3e and the ridge portion 3g.

In the present embodiment, the second electrode layer E2 continuously covers only the one part of the principal surface 3a, only the one part of the end surface 3e, and only the one part of each of the pair of side surfaces 3c. The second electrode layer E2 covers the entire ridge portion 3g, only the one part of the ridge portion 3i, and only the one part of the ridge portion 3j. The one part of a portion, of the first electrode layer E1, covering the ridge portion 3i is exposed from the second electrode layer E2. For example, the first electrode layer E1 included in the region $5c_1$ is exposed from the second electrode layer E2.

As illustrated in FIG. 2, a width of the region $5c_2$ in the third direction D3 decreases with an increase in distance from the principal surface 3a. The width of the region $5c_2$ in a third direction D3 decreases with an increase in distance from the electrode portion 5a. A width of the region $5c_2$ in the first direction D1 decreases with an increase in distance from the end surface 3e. The width of the region $5c_2$ in the first direction D1 decreases with an increase in distance from the electrode portion 5e. In the present embodiment, an end edge of the region $5c_2$ has an approximately arc shape when viewed from the second direction D2. The region $5c_2$ has an approximately fan shape when viewed from the second direction D2. In the present embodiment, as illustrated in FIG. 7, a width of the second electrode layer E2 viewed from the second direction D2 decreases with an increase in distance from the principal surface 3a. An end edge E2e of the second electrode layer E2 has an approximately arc shape.

Figure 9:
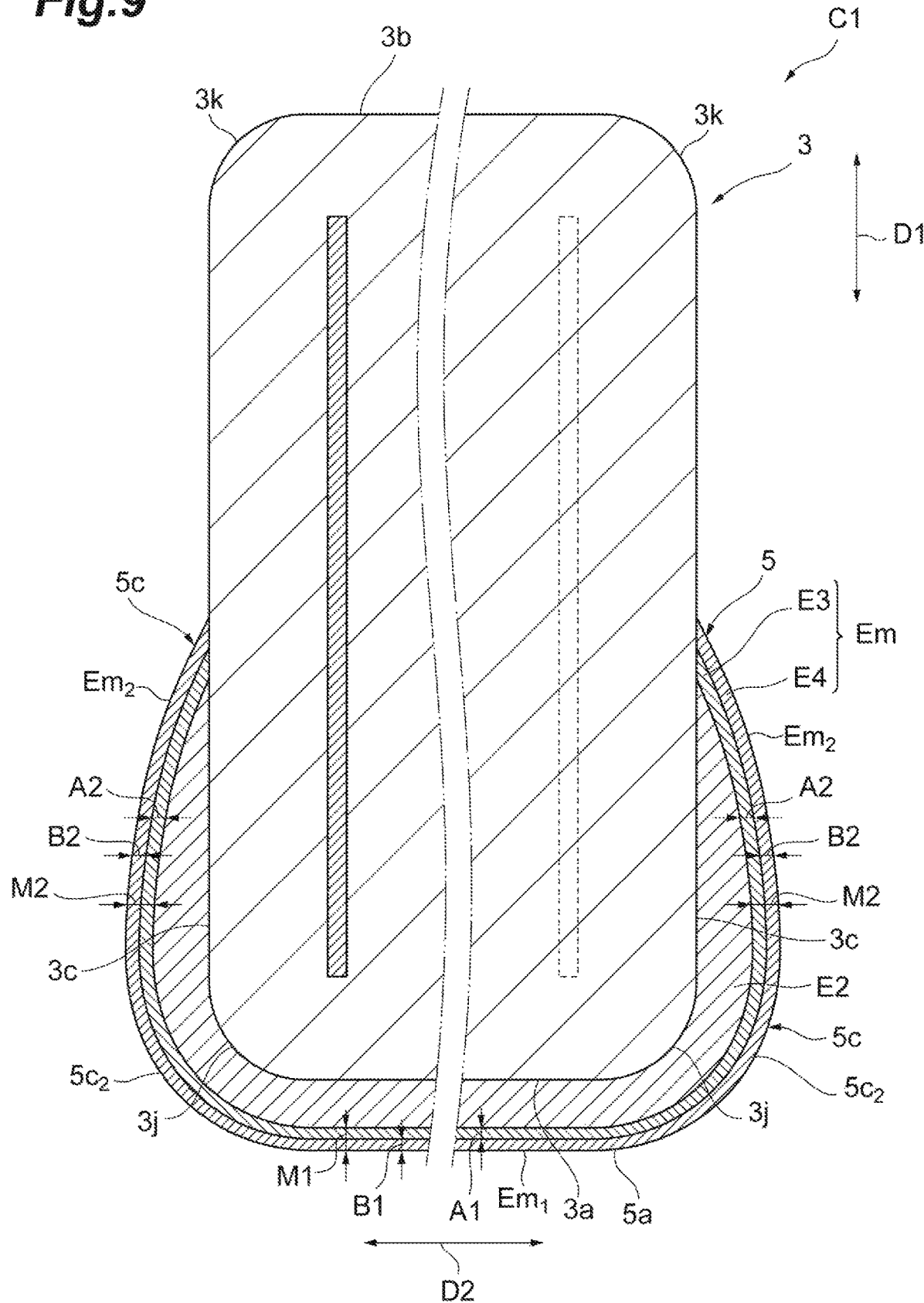
FIG. 9 is a view illustrating a cross-sectional configuration of the multilayer capacitor taken along line IX-IX in FIG. 2.
Figure 10:
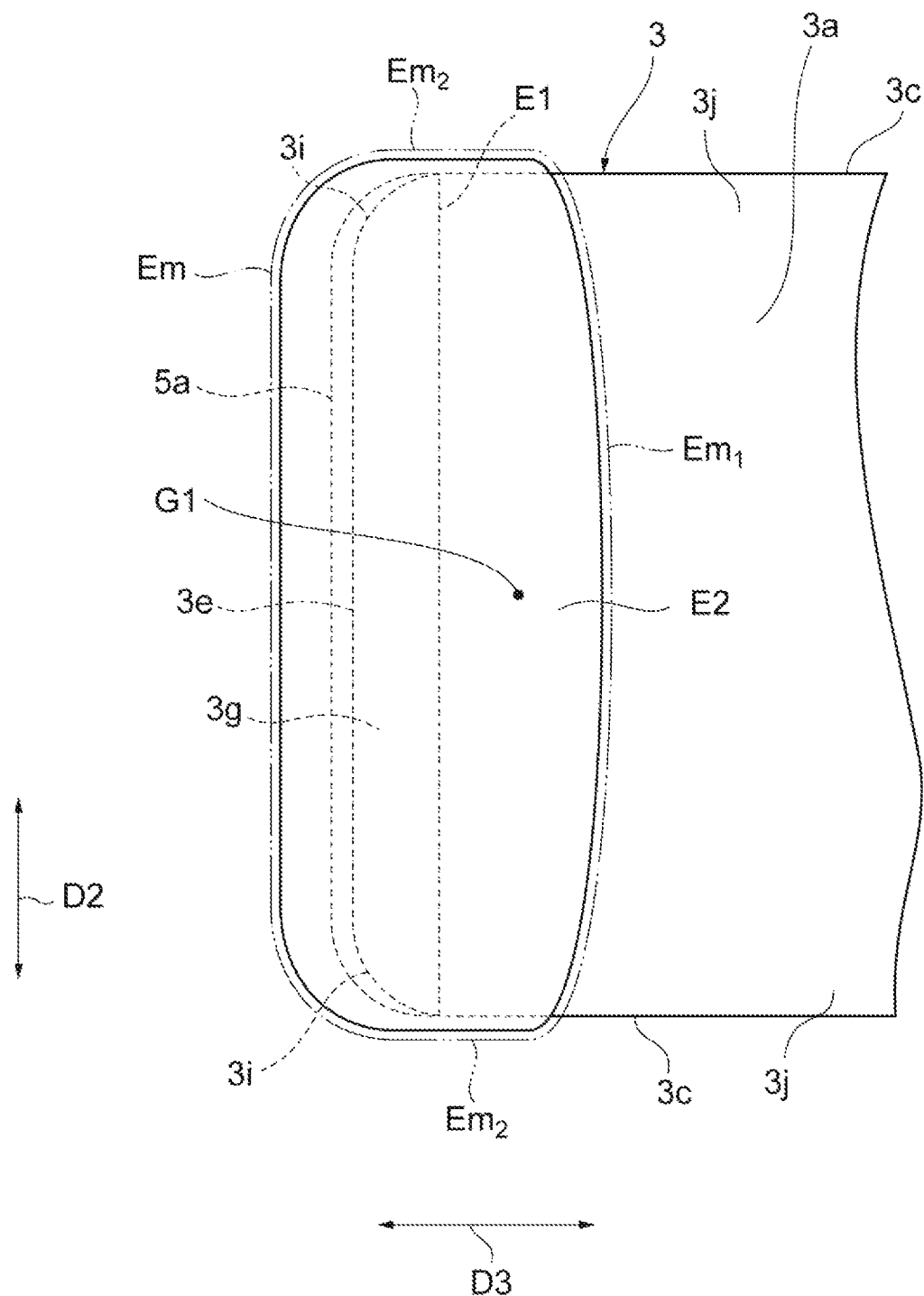
FIG. 10 is a plan view illustrating the element body, the first electrode layer, the second electrode layer, and a plating layer.
Figure 11:
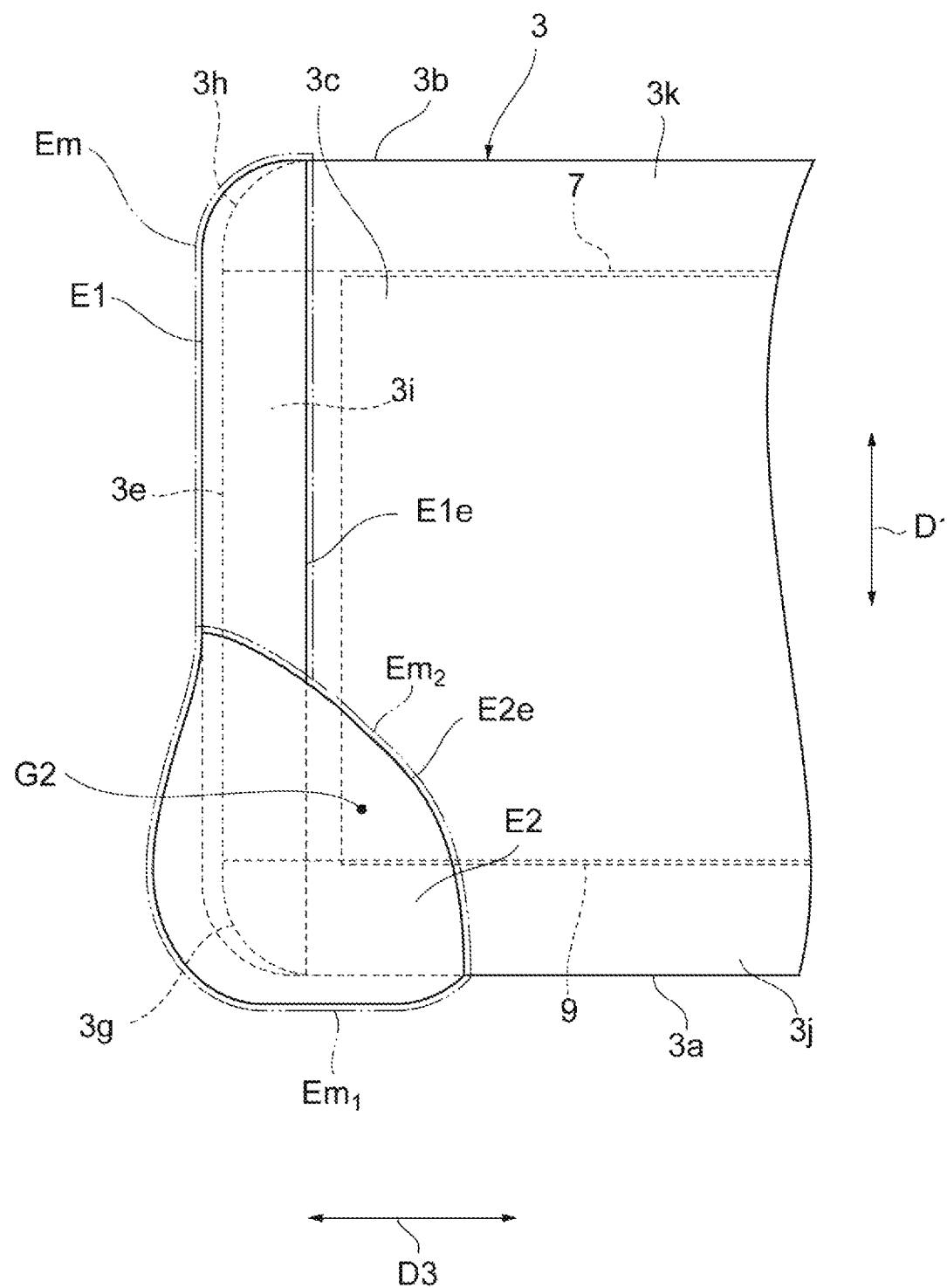
FIG. 11 is a side view illustrating the element body, the first electrode layer, the second electrode layer, and the plating layer.

Next, a thickness and an area of the plating layer Em will be described with reference to FIGS. 9 to 11. FIG. 9 is a view illustrating a cross-sectional configuration of the multilayer capacitor taken along line IX-IX in FIG. 2. FIG. 10 is a plan view illustrating the element body, the first electrode layer, the second electrode layer, and the plating layer. FIG. 11 is a side view illustrating the element body, the first electrode layer, the second electrode layer, and the plating layer. In FIGS. 10 and 11, the plating layer Em is indicated by a chain double-dashed line.

As illustrated in FIG. 9, the plating layer Em covers one part of the principal surface 3a and one part of each of the pair of side surfaces 3c. The one part of the principal surface 3a is, for example, a partial region near the end surface 3e, in the principal surface 3a. That is, the one part of the principal surface 3a is close to the end surface 3e. The one part of each of the pair of side surfaces 3c is, for example, a corner region near the principal surface 3a and end surface 3e, in each side surface 3c. That is, the one part of each of the pair of side surfaces 3c is close to principal surface 3a and end surface 3e. Each plating layer Em includes a portion $Em_1$ covering the principal surface 3a, and a pair of portions $Em_2$ covering the one part of each of the pair of side surfaces 3c. The portion $Em_1$ included in the plating layer Em is disposed in the partial region near the end surface 3e of the principal surface 3a. The portion $Em_2$ included in the plating layer Em is disposed in the corner region near the principal surface 3a and end surface 3e of the side surface 3c. The multilayer capacitor C1 includes the pair of external electrodes 5, and thus the multilayer capacitor C1 includes two portions $Em_1$ and four portions $Em_2$.

A thickness M1 of the portion $Em_1$ is smaller than a thickness M2 of each portion $Em_2$. In the present embodiment, the portion $Em_1$ is a portion of the plating layer Em located only on the principal surface 3a, when viewed from the first direction D1. Each portion $Em_2$ is a portion of the plating layer Em located only on each side surface 3c, when viewed from the second direction D2. The portion $Em_1$ may include, in addition to the portion of the plating layer Em located on the principal surface 3a, the portion of the plating layer Em located on each of the ridge portions 3g, 3i, and 3j, when viewed from the first direction D1. Each portion $Em_2$ may include, in addition to the portion of the plating layer Em located on each side surface 3c, the portion located on each of the ridge portions 3g, 3i, and 3j, when viewed from the second direction D2. The thickness M1 is a thickness in the direction orthogonal to the principal surface 3a (first direction D1). The thickness M2 is a thickness in the direction orthogonal to the side surface 3c (second direction D2).

The thickness M1 is measured, for example, at an approximately central position of the portion $Em_1$ when viewed from the first direction D1. The "approximately central position" includes, in addition to the center, a position away from the center due to a production error or a measurement error. The "approximately central position" also includes a position away from the center by a predetermined minute length. In the present embodiment, as illustrated in FIG. 10, the thickness M1 is measured at a gravity center position G1 of the portion $Em_1$ when viewed from the first direction D1. The thickness M1 may be measured at a gravity center position of the portion located on the principal surface 3a and each of the ridge portions 3g, 3i, and 3j in the plating layer Em when viewed from the first direction D1.

The thickness M2 is measured, for example, at an approximately central position of the portion $Em_2$ when viewed from the second direction D2. In the present embodiment, as illustrated in FIG. 11, the thickness M2 is measured at a gravity center position G2 of the portion $Em_2$ when viewed from the second direction D2. The thickness M2 may be measured at a gravity center position of the portion located on the side surface 3c and the ridge portions 3g, 3i, and 3j in the plating layer Em when viewed from the second direction D2. Each of the thicknesses M1 and M2 may be a thickness measured at one location or may be an average value of each thickness measured at a plurality of locations.

A thickness A1 of the third electrode layer E3 and a thickness B1 of the fourth electrode layer E4 are, in a similar manner to the thickness M1, thicknesses in the direction orthogonal to the principal surface 3a. Each of the thicknesses A1 and B1 is measured in a similar manner to the thickness M1. A thickness A2 of the third electrode layer E3 and a thickness B2 of the fourth electrode layer E4 are, in a similar manner to the thickness M2, thicknesses in the direction orthogonal to the side surface 3c. Each of the thicknesses A2 and B2 is measured in a similar manner to the thickness M2.

The thickness A1 is a thickness of a portion of the third electrode layer E3 covering the principal surface 3a. The thickness A2 is a thickness of each portion of the third electrode layer E3 covering the pair of side surfaces 3c. The thickness A1 is smaller than the thickness A2. The thickness B1 is a thickness of a portion of the fourth electrode layer E4 covering the principal surface 3a. The thickness B2 is a thickness of each portion of the fourth electrode layer E4 covering the pair of side surfaces 3c. The thickness B1 is smaller than the thickness B2. The sum of the thickness A1 and the thickness B1 is smaller than the sum of the thickness A2 and the thickness B2. The sum of the thickness A1 and the thickness B1 corresponds to the thickness M1. The sum of the thickness A2 and the thickness B2 corresponds to the thickness M2.

As illustrated in FIG. 10, when viewed from the first direction D1, the plating layer Em covers the principal surface 3a to extend between both ends of the principal surface 3a in the second direction D2. In contrast, as illustrated in FIG. 11, when viewed from the second direction D2, the plating layer Em covers only one part of the side surface 3c. The plating layer Em covers only a partial region near the principal surface 3a of the side surface 3c. An area of each portion $Em_2$ when viewed from the second direction D2 is smaller than an area of the portion $Em_1$ when viewed from the first direction D1. An area of the region of the plating layer Em covering the side surface 3c is smaller than an area of the region of the plating layer Em covering the principal surface 3a.

Figure 12:
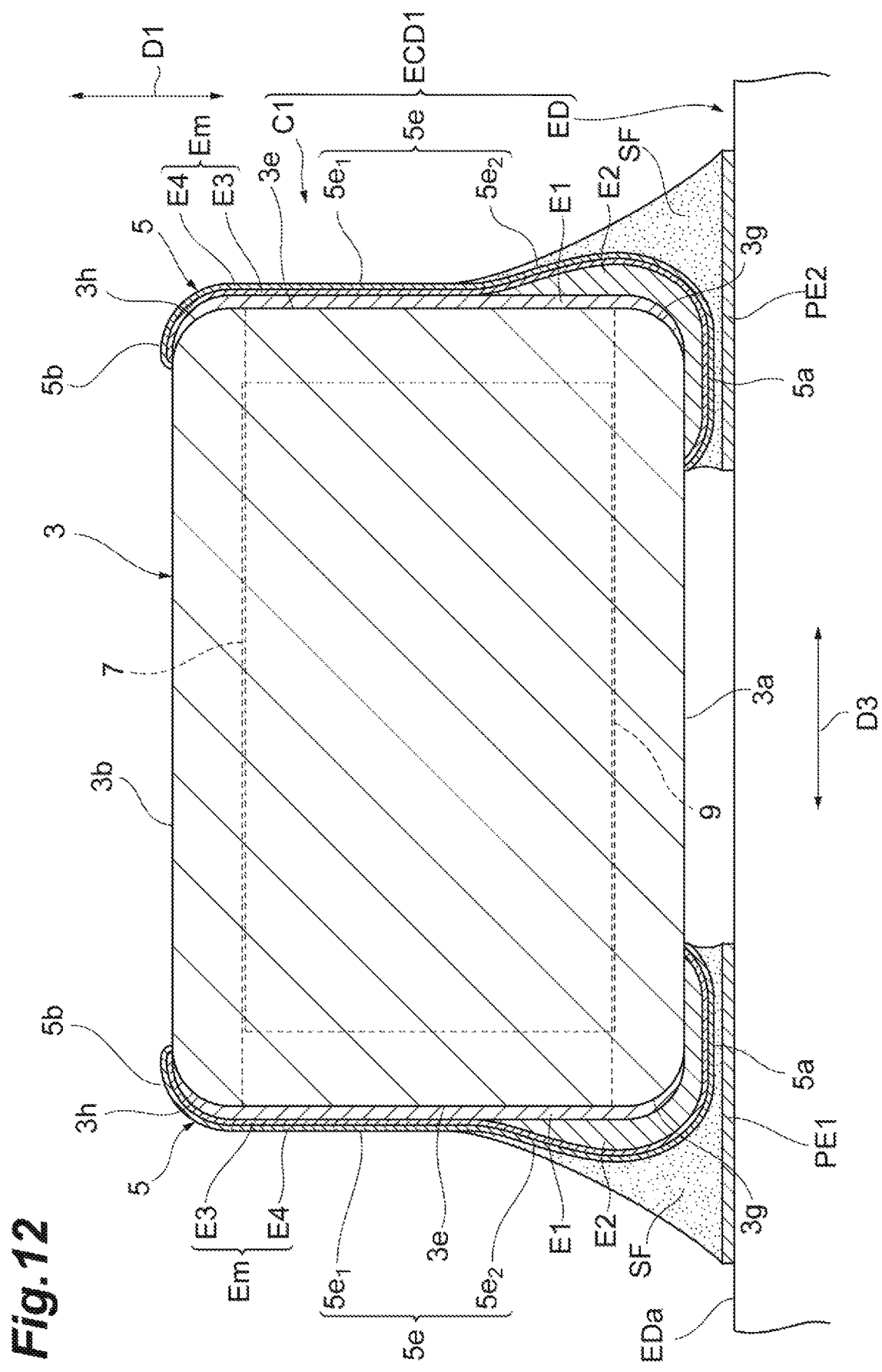
FIG. 12 is a view illustrating a mounting structure of the multilayer capacitor according to the first embodiment.

Next, a mounted structure of the multilayer capacitor C1 will be described with reference to FIG. 12. FIG. 12 is a view illustrating a mounted structure of a multilayer capacitor according to the first embodiment.

As illustrated in FIG. 12, an electronic component device ECD1 includes the multilayer capacitor C1 and an electronic device ED. The electronic device ED includes, for example, a circuit board or an electronic component.

The multilayer capacitor C1 is solder-mounted on the electronic device ED. The electronic device ED includes a principal surface EDa and a plurality of pad electrodes PE1 and PE2. In the present embodiment, the electronic device ED includes two pad electrodes PE1 and PE2. Each of the pad electrodes PE1 and PE2 is disposed on the principal surface EDa. The two pad electrodes PE1 and PE2 are separated from each other. The multilayer capacitor C1 is disposed on the electronic device ED in such a manner that the principal surface 3a and the principal surface EDa oppose each other. As described above, the principal surface 3a is arranged to constitute a mounting surface.

When the multilayer capacitor C1 is solder-mounted, molten solder wets to the external electrodes 5 (fourth electrode layer E4). Solder fillets SF are formed on the external electrodes 5 by solidification of the wet solder. The external electrodes 5 and the pad electrodes PE1 and PE2 corresponding to each other are coupled via the solder fillets SF.

The solder fillet SF is formed on the regions $5e_1$ and $5e_2$ of the electrode portion 5e. In addition to the region $5e_2$, the region $5e_1$ that does not include the second electrode layer E2 is also coupled to the corresponding pad electrode PE1 or PE2 via the solder fillet SF. Although illustration is omitted, the solder fillet SF is also formed on the regions $5c_1$ and $5c_2$ of the electrode portion 5c. The solder fillet SF overlaps the region $5e_1$ of the electrode portion 5e when viewed from the third direction D3. The solder fillet SF overlaps the first electrode layer E1 included in the region $5e_1$ when viewed from the third direction D3. A height of the solder fillet SF in the first direction D1 is larger than a height of the second electrode layer E2 in the first direction D1. The solder fillet SF extends closer to the principal surface 3b beyond the end edge E2e of the second electrode layer E2 in the first direction D1.

As described above, in the first embodiment, the thickness M1 of the portion $Em_1$ is smaller than the thickness M2 of each portion $Em_2$. The thickness of the plating layer Em is smaller at the portion $Em_1$ than at each portion $Em_2$, and thus residual stress of the portion $Em_1$ is small. Therefore, the multilayer capacitor C1 suppresses occurrence of a crack due to the residual stress acting on the principal surface 3a. Since the thickness of the plating layer Em is larger at each portion $Em_2$ than at the portion $Em_1$, in a case in which the external electrode 5 and the electronic device ED are joined by soldering, the solder tends to run around each portion $Em_2$. Therefore, the multilayer capacitor C1 ensures bonding strength by soldering between the external electrode 5 and the electronic device ED. Consequently, the multilayer capacitor C1 ensures the bonding strength by soldering and suppresses the occurrence of a crack in the element body 3.

When the thickness of the plating layer Em is larger at each portion $Em_2$ than at the portion $Em_1$, the residual stress at each portion $Em_2$ may increase. In the multilayer capacitor C1, each area of the pair of portions $Em_2$ is smaller than the area of the portion $Em_1$. A configuration in which each area of the pair of portions $Em_2$ is smaller than the area of the portion $Em_1$ suppresses an increase in residual stress at each portion $Em_2$. Therefore, the multilayer capacitor C1 suppresses the occurrence of a crack due to the residual stress acting on each side surface 3c.

In the multilayer capacitor C1, each portion $Em_2$ is disposed in a region near the principal surface 3a of the corresponding side surface 3c of the pair of side surfaces 3c. In the multilayer capacitor C1, the area of each portion $Em_2$ is small, as compared with in a configuration in which each portion $Em_2$ is disposed to extend between the principal surface 3a and the principal surface 3b. Therefore, even in a case in which the residual stress in the portion $Em_2$ increases due to the large thickness of the portion $Em_2$, the multilayer capacitor C1 suppresses the increase in the residual stress in the portion $Em_2$. Consequently, the multilayer capacitor C1 suppresses the occurrence of a crack due to the residual stress acting on each side surface 3c.

In the multilayer capacitor C1, each external electrode 5 includes the second electrode layer E2. The second electrode layer E2 covers the one part of the principal surface 3a and the one part of each of the pair of side surfaces 3c. The plating layer Em is disposed on the second electrode layer E2. The second electrode layer E2 is located between the principal surface 3a and pair of side surfaces 3c and the plating layer Em. Therefore, the residual stress of the plating layer Em tends not to act on the element body 3. Consequently, the multilayer capacitor C1 reliably suppresses the occurrence of a crack in the element body 3.

A region between the element body 3 and the second electrode layer E2 may include a path through which moisture infiltrates. In a case in which moisture infiltrates from the region between the element body 3 and the second electrode layer E2, durability of the multilayer capacitor C1 decreases. In the multilayer capacitor C1, the second electrode layer E2 covers one part of the end surface 3e. Therefore, the multilayer capacitor C1 includes few paths through which moisture infiltrates, as compared with a configuration in which the second electrode layer E2 covers the entire end surface 3e. Consequently, the multilayer capacitor C1 improves moisture resistance reliability.

In a case in which the multilayer capacitor C1 is solder-mounted on the electronic device ED, external force applied onto the multilayer capacitor C1 from the electronic device ED may act as stress on the element body 3. The external force acts on the element body 3 from the solder fillet SF formed at the solder-mounting, through the external electrode 5. In this case, a crack may occur in the element body 3. The external force tends to act on a region defined by the one part of the principal surface 3a, the one part of each of the pair of side surfaces 3c, and the one part of the end surface 3e, in the element body 3. In the multilayer capacitor C1, the second electrode layer E2 covers the one part of the principal surface 3a, the one part of each of the pair of side surfaces 3c, and the one part of the end surface 3e. Therefore, the external force applied onto the multilayer capacitor C1 from the electronic device ED tends not to act on the element body 3. Consequently, the multilayer capacitor C1 suppresses occurrence of a crack in the element body 3.

In the multilayer capacitor C1, each external electrode 5 includes the first electrode layer E1 formed on the end surface 3e to be connected to the corresponding internal electrodes 7 and 9. Therefore, the external electrode 5 is favorably in contact with the corresponding internal electrodes 7 and 9 by the first electrode layer E1. Therefore, the multilayer capacitor C1 allows reliable electrical connection between the external electrode 5 and the internal electrodes 7 and 9 that correspond to each other.

The electric resistance of the second electrode layer E2 is larger than the electric resistance of the first electrode layer E1. In a case in which the first electrode layer E1 includes the region exposed from the second electrode layer E2, the region of the first electrode layer E1 exposed from the second electrode layer E2 is electrically connected to the electronic device without passing through the second electrode layer E2. Therefore, the multilayer capacitor C1 suppresses an increase of ESR even in a case in which the external electrode 5 includes the second electrode layer E2.

The bonding strength between the second electrode layer E2 and the element body 3 is smaller than the bonding strength between the second electrode layer E2 and the first electrode layer E1. Therefore, the second electrode layer E2 may peel off from the element body 3. In the multilayer capacitor C1, the first electrode layer E1 is formed on the ridge portion 3g. Therefore, even in a case in which the second electrode layer E2 peels off from the element body 3, the peel-off of the second electrode layer E2 tends not to develop to a position corresponding to the end surface 3e beyond a position corresponding to the ridge portion 3g.

In the multilayer capacitor C1, the first electrode layer E1 is formed on the ridge portion 3i. Therefore, even in a case in which the second electrode layer E2 peels off from the element body 3, the peel-off of the second electrode layer E2 tends not to develop to a position corresponding to the end surface 3e beyond a position corresponding to the ridge portion 3i. In the multilayer capacitor C1, the second electrode layer E2 covers one part of the ridge portion 3i. The multilayer capacitor C1 includes few paths through which moisture infiltrates, as compared with a configuration in which the second electrode layer E2 covers the entire ridge portion 3i. Consequently, the multilayer capacitor C1 improves the moisture resistance reliability.

In the multilayer capacitor C1, the plating layer Em includes the intermediate layer (third electrode layer E3). The intermediate layer is located inside the outermost layer (fourth electrode layer E4) and includes the Ni plating layer. Therefore, the multilayer capacitor C1 improves solder corrosion resistance.

In the multilayer capacitor C1, the plating layer Em includes the outermost layer that includes the Sn plating layer. Therefore, the multilayer capacitor C1 improves solder-bonding strength.

Second Embodiment

Figure 13:
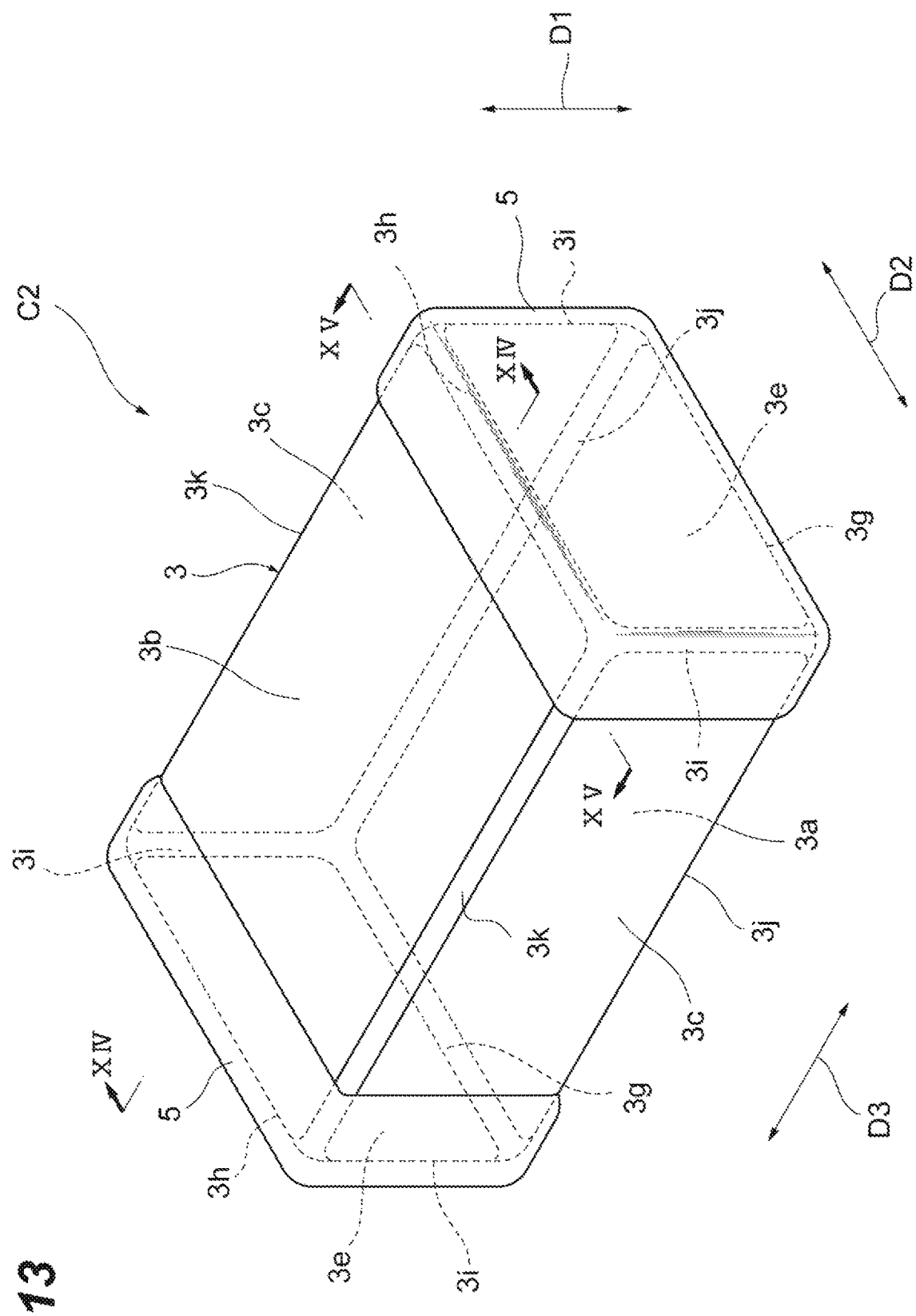
FIG. 13 is a perspective view of a multilayer capacitor according to a second embodiment.
Figure 14:
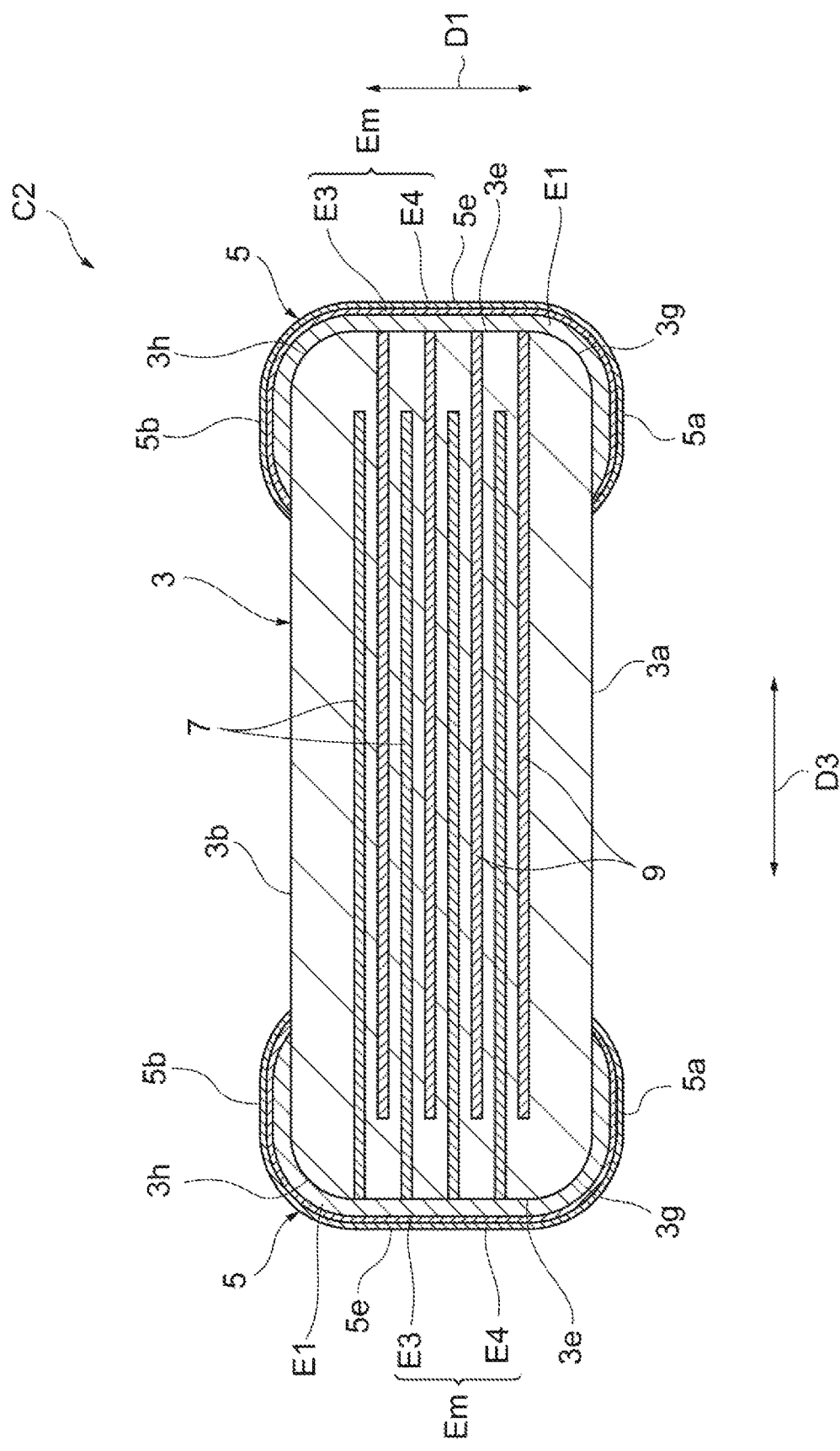
FIG. 14 is a view illustrating a cross-sectional configuration of the multilayer capacitor taken along line XIV-XIV in FIG. 13.

A configuration of a multilayer capacitor C2 according to a second embodiment will be described with reference to FIGS. 13 to 15. FIG. 13 is a perspective view of a multilayer capacitor according to the second embodiment. FIG. 14 is a view illustrating a cross-sectional configuration of the multilayer capacitor taken along line XIV-XIV in FIG. 13. FIG. 15 is a view illustrating a cross-sectional configuration of the multilayer capacitor taken along line XV-XV in FIG. 13. In FIG. 15, illustration of internal electrodes 7 and 9 is omitted. In the second embodiment, an electronic component is, for example, the multilayer capacitor C2. Hereinafter, differences between the multilayer capacitor C1 and the multilayer capacitor C2 will be mainly described.

As illustrated in FIG. 13, the multilayer capacitor C2 includes the element body 3 and the pair of external electrodes 5. The length of the element body 3 in the second direction D2 is larger than the length of the element body 3 in the first direction D1. The multilayer capacitor C2 is a low-profile multilayer capacitor.

As illustrated in FIG. 14, the multilayer capacitor C2 includes the plurality of internal electrodes 7 and the plurality of internal electrodes 9. The internal electrodes 7 and the internal electrodes 9 are disposed in different positions (layers) in the first direction D1. The internal electrodes 7 and the internal electrodes 9 are alternately disposed in the element body 3 to oppose each other in the first direction D1 with an interval therebetween.

In the multilayer capacitor C2, the electrode portion 5b is disposed on the ridge portion 3h and the principal surface 3b. The external electrode 5 is formed on the principal surface 3b. The external electrode 5 is formed on the five surfaces, that is, the pair of principal surface 3a and 3b, the end surface 3e, and the pair of side surfaces 3c, as well as on the ridge portions 3g, 3h, 3i, and 3j.

The external electrode 5 includes a first electrode layer E1, a third electrode layer E3, and a fourth electrode layer E4, and does not include a second electrode layer E2. The first electrode layer E1 covers, in addition to the end surface 3e and ridge portions 3g, 3h, and 3i, one part of each of the pair of principal surfaces 3a and 3b, and one part of each of the pair of side surfaces 3c. The third electrode layer E3 is disposed on the first electrode layer E1. The fourth electrode layer E4 is disposed on the third electrode layer E3. Each of electrode portions 5a, 5b, 5c, and 5e includes the first electrode layer E1, the third electrode layer E3, and the fourth electrode layer E4. Each of the electrode portions 5a, 5b, 5c, and 5e is three-layered.

The first electrode layer E1 included in the electrode portion 5a is disposed on the ridge portion 3g and the principal surface 3a. The first electrode layer E1 included in the electrode portion 5a covers one part of the principal surface 3a. The one part of the principal surface 3a is, for example, a partial region near the end surface 3e, in the principal surface 3a. That is, the one part of the principal surface 3a is close to the end surface 3e. The third electrode layer E3 included in the electrode portion 5a indirectly covers the entire ridge portion 3g and the one part of the principal surface 3a in such a manner that the first electrode layer E1 is located between the third electrode layer E3 and the ridge portion 3g and principal surface 3a. The third electrode layer E3 included in the electrode portion 5a directly covers the entire portion of the first electrode layer E1 formed on the ridge portion 3g. The third electrode layer E3 included in the electrode portion 5a directly covers the entire portion of the first electrode layer E1 formed on the principal surface 3a.

The fourth electrode layer E4 included in the electrode portion 5a indirectly covers the entire ridge portion 3g and the one part of the principal surface 3a in such a manner that the first electrode layer E1 and third electrode layer E3 are located between the fourth electrode layer E4 and the ridge portion 3g and principal surface 3a. The fourth electrode layer E4 included in the electrode portion 5a directly covers the entire portion of the third electrode layer E3 indirectly covering the ridge portion 3g. The fourth electrode layer E4 included in the electrode portion 5a directly covers the entire portion of the third electrode layer E3 indirectly covering the principal surface 3a.

The first electrode layer E1 included in the electrode portion 5b is disposed on the ridge portion 3h and the principal surface 3b. The first electrode layer E1 included in the electrode portion 5b covers one part of the principal surface 3b. The one part of the principal surface 3b is, for example, a partial region near the end surface 3e, in the principal surface 3b. That is, the one part of the principal surface 3b is close to the end surface 3e. The third electrode layer E3 included in the electrode portion 5b indirectly covers the entire ridge portion 3h and the one part of the principal surface 3b in such a manner that the first electrode layer E1 is located between the third electrode layer E3 and the ridge portion 3h and principal surface 3b. The third electrode layer E3 included in the electrode portion 5b directly covers the entire portion of the first electrode layer E1 formed on the ridge portion 3h. The third electrode layer E3 included in the electrode portion 5b directly covers the entire portion of the first electrode layer E1 formed on the principal surface 3b.

The fourth electrode layer E4 included in the electrode portion 5b indirectly covers the entire ridge portion 3h and the one part of the principal surface 3b in such a manner that the first electrode layer E1 and third electrode layer E3 are located between the fourth electrode layer E4 and the ridge portion 3h and principal surface 3b. The fourth electrode layer E4 included in the electrode portion 5b directly covers the entire portion of the third electrode layer E3 indirectly covering the ridge portion 3h. The fourth electrode layer E4 included in the electrode portion 5b directly covers the entire portion of the third electrode layer E3 indirectly covering the principal surface 3b.

The first electrode layer E1 included in the electrode portion 5c is disposed on the ridge portion 3i and the side surface 3c. The electrode portion 5c is three-layered at any position on the ridge portion 3i and the side surface 3c. The first electrode layer E1 included in the electrode portion 5c covers one part of the side surface 3c. The one part of the side surface 3c is, for example, a partial region near the end surface 3e in the side surface 3c. That is, the one part of the side surface 3c is close to the end surface 3e. The third electrode layer E3 included in the electrode portion 5c indirectly covers the entire ridge portion 3i and the one part of the side surface 3c in such a manner that the first electrode layer E1 is located between the third electrode layer E3 and the ridge portion 3i and side surface 3c. The third electrode layer E3 included in the electrode portion 5c directly covers the entire portion of the first electrode layer E1 formed on the ridge portion 3i. The third electrode layer E3 included in the electrode portion 5c directly covers the entire portion of the first electrode layer E1 formed on the side surface 3c.

The fourth electrode layer E4 included in the electrode portion 5c indirectly covers the entire ridge portion 3i and the one part of the side surface 3c in such a manner that the first electrode layer E1 and third electrode layer E3 are located between the fourth electrode layer E4 and the ridge portion 3i and side surface 3c. The fourth electrode layer E4 included in the electrode portion 5c directly covers the entire portion of the third electrode layer E3 indirectly covering the ridge portion 3i. The fourth electrode layer E4 included in the electrode portion 5c directly covers the entire portion of the third electrode layer E3 formed on the side surface 3c with the first electrode layer E1 therebetween.

The first electrode layer E1 included in the electrode portion 5e is disposed on the end surface 3e. The first electrode layer E1 included in the electrode portion 5e covers the entire end surface 3e. The electrode portion 5e is three-layered in the entire region on the end surface 3e. The third electrode layer E3 included in the electrode portion 5e indirectly covers the entire end surface 3e in such a manner that the first electrode layer E1 is located between the third electrode layer E3 and the end surface 3e. The third electrode layer E3 included in the electrode portion 5e directly covers the entire portion of the first electrode layer E1 formed on the end surface 3e.

The fourth electrode layer E4 included in the electrode portion 5e indirectly covers the entire end surface 3e in such a manner that the first electrode layer E1 and third electrode layer E3 are located between the fourth electrode layer E4 and the end surface 3e. The fourth electrode layer E4 included in the electrode portion 5e directly covers the entire portion of the third electrode layer E3 indirectly covering the end surface 3e.

As illustrated in FIG. 15, the plating layer Em includes a portion $Em_1$ covering the principal surface 3a, a pair of portions $Em_2$ covering one part of each of the pair of side surfaces 3c, and a portion $Em_3$ covering the principal surface 3b. In the multilayer capacitor C2 as well, in a similar manner to the multilayer capacitor C1, a thickness M1 of the portion $Em_1$ is smaller than a thickness M2 of each portion $Em_2$. In the multilayer capacitor C2, a thickness of the portion $Em_3$ is equivalent to the thickness M1, and is smaller than the thickness M2. The multilayer capacitor C2 is low-profile, in a similar manner to the multilayer capacitor C1. Therefore, an area of each portion $Em_2$ when viewed from the second direction D2 is smaller than an area of the portion $Em_1$ when viewed from the first direction D1.

As described above, in the second embodiment, the thickness of the plating layer Em is smaller at the portion $Em_1$ than at each portion $Em_2$ in a similar manner to the first embodiment. Therefore, the multilayer capacitor C2 ensures bonding strength by soldering and suppresses occurrence of a crack in the element body 3.

In the multilayer capacitor C2, each area of the pair of portions $Em_2$ is smaller than the area of the portion $Em_1$. Therefore, the multilayer capacitor C2 suppresses the occurrence of a crack due to residual stress acting on each side surface 3c in a similar manner to the multilayer capacitor C1.

Although the embodiments and modifications of the present invention have been described above, the present invention is not necessarily limited to the embodiments and modifications, and the embodiment can be variously changed without departing from the scope of the invention.

The first electrode layer E1 may be formed on the principal surface 3a to extend over the ridge portion 3g entirely or partially from the end surface 3e. The first electrode layer E1 may be formed on the principal surface 3b to extend beyond the ridge portion 3h entirely or partially from the end surface 3e. The first electrode layer E1 may be formed on the side surface 3c to extend beyond the ridge portion 3i entirely or partially from the end surface 3e.

The second electrode layer E2 may cover not only the one part of the end surface 3e, that is, the partial region near the principal surface 3a of the end surface 3e but also the entire end surface 3e. The second electrode layer E2 may cover one part of the principal surface 3b to extend beyond the entire or one part of the ridge portion 3h. The second electrode layer E2 may cover one part of the side surface 3c to extend beyond the entire ridge portion 3i from the end surface 3e.

In the multilayer capacitor C1, a thickness of the portion of the plating layer Em covering the ridge portion 3h may be larger than the thickness M2. The thickness of the plating layer Em may be the largest at the portion covering the ridge portion 3h. The plating layer Em may be formed to cover the principal surface 3b beyond the entire or one part of the ridge portion 3h. In this case, the thickness of the portion of the plating layer Em covering the principal surface 3b may be larger than the thickness M2. The thickness of the plating layer Em may be the largest at the portion $Em_2$.

In the first embodiment, the external electrode 5 is formed on four surfaces of one principal surface 3a, one end surface 3e, and the pair of side surfaces 3c, and ridge portions 3g, 3h, 3i, and 3j. However, the configuration of the external electrode 5 is not limited thereto. The external electrode 5 may be formed at least on the principal surface 3a and the side surface 3c.

The electronic component of the first embodiment is the multilayer capacitor C1, and the electronic component of the second embodiment is the multilayer capacitor C2. Applicable electronic component is not limited to the multilayer capacitor. Examples of the applicable electronic components include, but not limited to, multilayer electronic components such as a multilayer feedthrough capacitor, a multilayer inductor, a multilayer varistor, a multilayer piezoelectric actuator, a multilayer thermistor, or a multilayer composite component, and electronic components other than the multilayer electronic components.

What is claimed is:

1. An electronic component, comprising:
   an element body of a rectangular parallelepiped shape including a first principal surface arranged to constitute a mounting surface, a second principal surface opposing the first principal surface in a first direction, a pair of side surfaces opposing each other in a second direction, and a pair of end surfaces opposing each other in a third direction; and
   a plurality of external electrodes disposed at both end portions of the element body in the third direction, wherein
   the plurality of external electrodes includes a plating layer including a first portion covering the first principal surface and a pair of second portions covering the pair of side surfaces, and
   a thickness of the first portion is smaller than each thickness of the pair of second portions.

2. The electronic component according to claim 1, wherein
   each area of the pair of second portions is smaller than an area of the first portion.

3. The electronic component according to claim 1, wherein
   each of the pair of second portions is disposed in a region near the first principal surface of a corresponding side surface of the pair of side surfaces.

4. The electronic component according to claim 1, wherein
   each of the plurality of external electrodes includes a conductive resin layer covering one part of the first principal surface and one part of each of the pair of side surfaces, and
   the plating layer is disposed on the conductive resin layer.

5. The electronic component according to claim 4, wherein
   each of the plurality of external electrodes is formed on a corresponding end surface of the pair of end surfaces, and
   the conductive resin layer further covers one part of the corresponding end surface.

6. The electronic component according to claim 5, further comprising:
   an internal conductor exposed to the corresponding end surface of the pair of end surfaces, wherein each of the plurality of external electrodes further includes a sintered metal layer formed at least on the end surface to be connected to the internal conductor.

7. The electronic component according to claim 6, wherein
the sintered metal layer includes a first region covered with the conductive resin layer, and a second region exposed from the conductive resin layer.

8. The electronic component according to claim 6, wherein
the sintered metal layer is also formed on a first ridge portion located between the first principal surface and the end surface, and
the conductive resin layer covers an entirety of a portion of the sintered metal layer formed on the first ridge portion.

9. The electronic component according to claim 6, wherein
the sintered metal layer is also formed on a second ridge portion located between the side surface and the end surface, and
the conductive resin layer covers one part of a portion of the sintered metal layer formed on the second ridge portion.

10. The electronic component according to claim 1, wherein
the plating layer includes an outermost layer, and an intermediate layer that is located inside the outermost layer and includes an Ni plating layer.

11. The electronic component according to claim 1, wherein
the plating layer includes an outermost layer including an Sn plating layer.

12. An electronic component, comprising:
an element body of a rectangular parallelepiped shape including a first principal surface arranged to constitute a mounting surface, a second principal surface opposing the first principal surface in a first direction, a pair of side surfaces opposing each other in a second direction, and a pair of end surfaces opposing each other in a third direction; and
an external electrode disposed at an end portion of the element body in the third direction, wherein
the external electrode includes a plating layer including a first portion covering the first principal surface and a pair of second portions covering the pair of side surfaces, and
a thickness of the first portion is smaller than each thickness of the pair of second portions.

* * * * *